(12) United States Patent
Lin et al.

(10) Patent No.: US 12,300,732 B2
(45) Date of Patent: *May 13, 2025

(54) GATE ALL AROUND TRANSISTOR WITH DUAL INNER SPACERS

(71) Applicant: Taiwan Semiconductor Manufacturing Co., Ltd., Hsinchu (TW)

(72) Inventors: Zhi-Chang Lin, Hsinchu (TW); Kuan-Ting Pan, Hsinchu (TW); Shih-Cheng Chen, Hsinchu (TW); Jung-Hung Chang, Hsinchu (TW); Lo-Heng Chang, Hsinchu (TW); Chien-Ning Yao, Hsinchu (TW); Kuo-Cheng Chiang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/584,862

(22) Filed: Feb. 22, 2024

(65) Prior Publication Data

US 2024/0194758 A1 Jun. 13, 2024

Related U.S. Application Data

(63) Continuation of application No. 17/370,833, filed on Jul. 8, 2021, now Pat. No. 11,916,122.

(51) Int. Cl.
*H01L 29/423* (2006.01)
*H01L 29/06* (2006.01)
*H01L 29/40* (2006.01)
*H01L 29/66* (2006.01)
*H01L 29/786* (2006.01)

(52) U.S. Cl.
CPC .... *H01L 29/42392* (2013.01); *H01L 29/0665* (2013.01); *H01L 29/401* (2013.01); *H01L 29/6653* (2013.01); *H01L 29/78696* (2013.01)

(58) Field of Classification Search
CPC .......... H01L 29/42392; H01L 29/0665; H01L 29/401; H01L 29/6653; H01L 29/78696; H01L 21/823437; H01L 21/823481; H01L 29/0673; H01L 29/20; H01L 29/66469; H01L 29/66439; H01L 29/66545; H01L 29/775; H01L 21/823412; H01L 21/823431; H01L 29/0642; H01L 29/785; B82Y 10/00
USPC ...................................................... 257/401
See application file for complete search history.

(56) References Cited

U.S. PATENT DOCUMENTS

| | | |
|---|---|---|
| 9,236,267 B2 | 1/2016 | De et al. |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |

(Continued)

*Primary Examiner* — Tong-Ho Kim
(74) *Attorney, Agent, or Firm* — Seed IP Law Group

(57) ABSTRACT

A method for forming a gate all around transistor includes forming a plurality of semiconductor nanosheets. The method includes forming a cladding inner spacer between a source region of the transistor and a gate region of the transistor. The method includes forming sheet inner spacers between the semiconductor nanosheets in a separate deposition process from the cladding inner spacer.

20 Claims, 27 Drawing Sheets

(56) References Cited

U.S. PATENT DOCUMENTS

| | | |
|---|---|---|
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 11,916,122 B2 * | 2/2024 | Lin .................. H01L 29/66545 |
| 2020/0083352 A1 * | 3/2020 | Chanemougame .......................... H01L 29/6681 |

* cited by examiner

GATE ALL AROUND TRANSISTOR WITH DUAL INNER SPACERS

BACKGROUND

Technical Field

The present disclosure relates to the field of semiconductor fabrication. The present disclosure relates more particularly to spacer layers associated with semiconductor nanosheets of gate all around transistors.

Description of the Related Art

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Gate all around transistors can assist in increasing computing power because the gate all around transistors can be very small and can have improved functionality over convention transistors. A gate all around transistor may include a plurality of semiconductor nanosheets or nanowires that act as the channel regions for a transistor. However, it can be difficult to effectively insulate the semiconductor nanosheets.

DETAILED DESCRIPTION

Figure 1A:
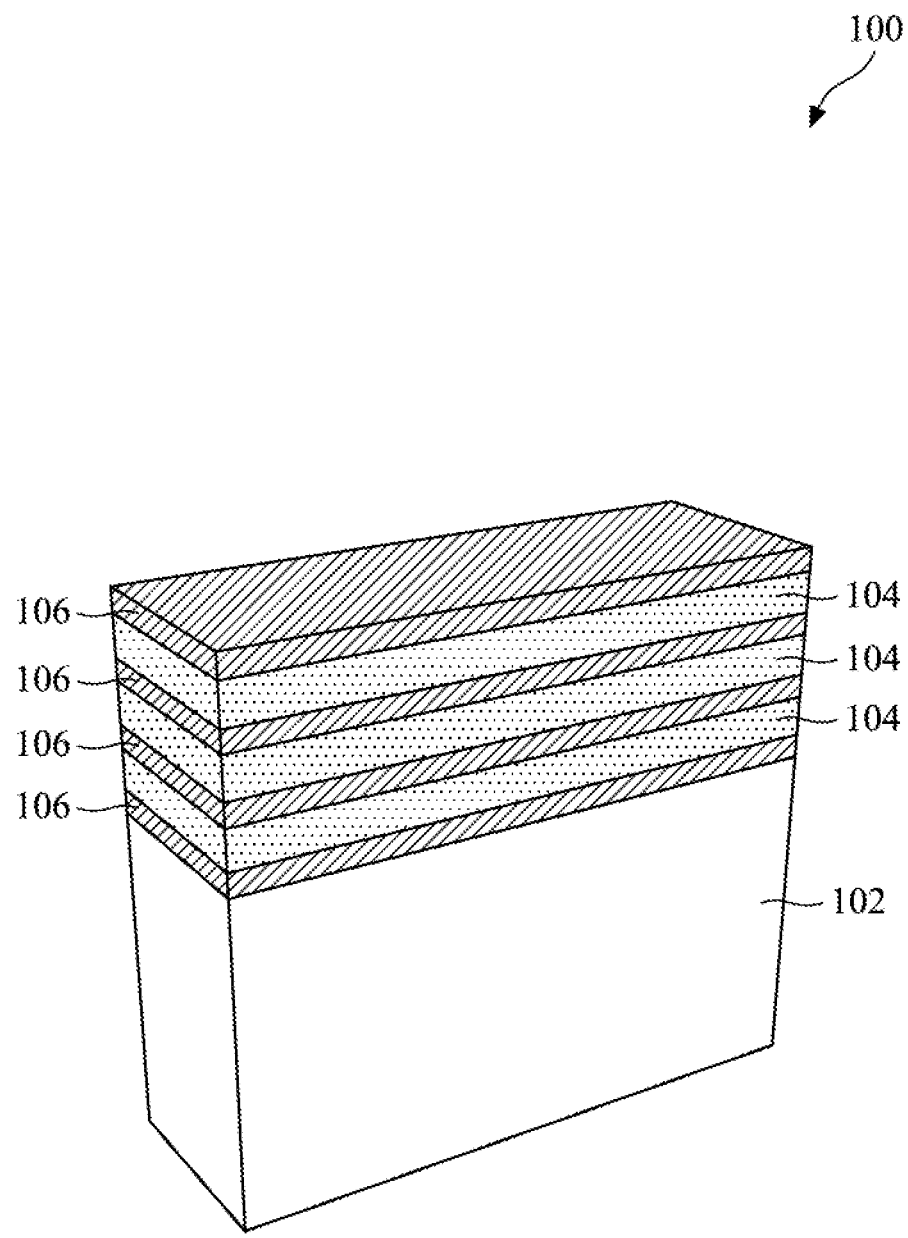
FIGS. 1A-1W are perspective views of an integrated circuit at various stages of processing, according to embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit including gate all around transistors each having a plurality of semiconductor nanosheets corresponding to channel regions of the transistor. Embodiments of the present disclosure provide improved dielectric spacers for the semiconductor nanosheets by providing sacrificial semiconductor regions having different compositions, and, therefore, different etching characteristics. A first sacrificial region corresponds to the semiconductor material that is eventually removed from between the semiconductor nanosheets. A second sacrificial semiconductor region corresponds to a semiconductor cladding that laterally surrounds the stack of semiconductor nanosheets before eventually being removed. Because the first and second sacrificial semiconductor regions have different compositions, they can be selectively etched in a way that results in formation of high quality dielectric spacers. This has several benefits including that the top nanosheets are not damaged during etching processes, that the AC performance of the transistor is improved over conventional methods, that cladding integrity at merge points is high, and that there is no need to handle recess loading between the first and second sacrificial semiconductor regions. The result is that transistors have better performance and that processing yields are improved.

Figure 1B:
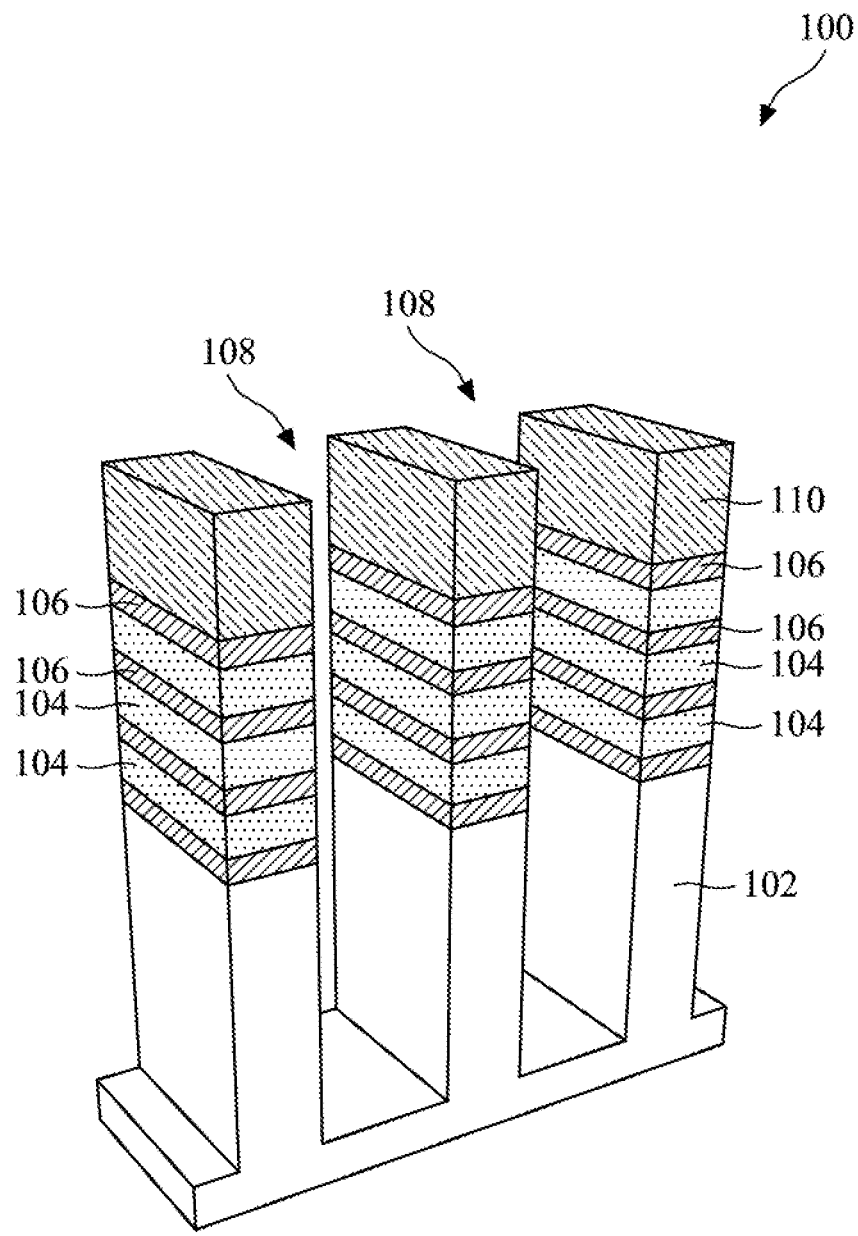
FIGS. 1X-2 are cross-sectional views of the integrated circuit of FIG. 1W taken along various cut lines, according to embodiments.
Figure 1C:
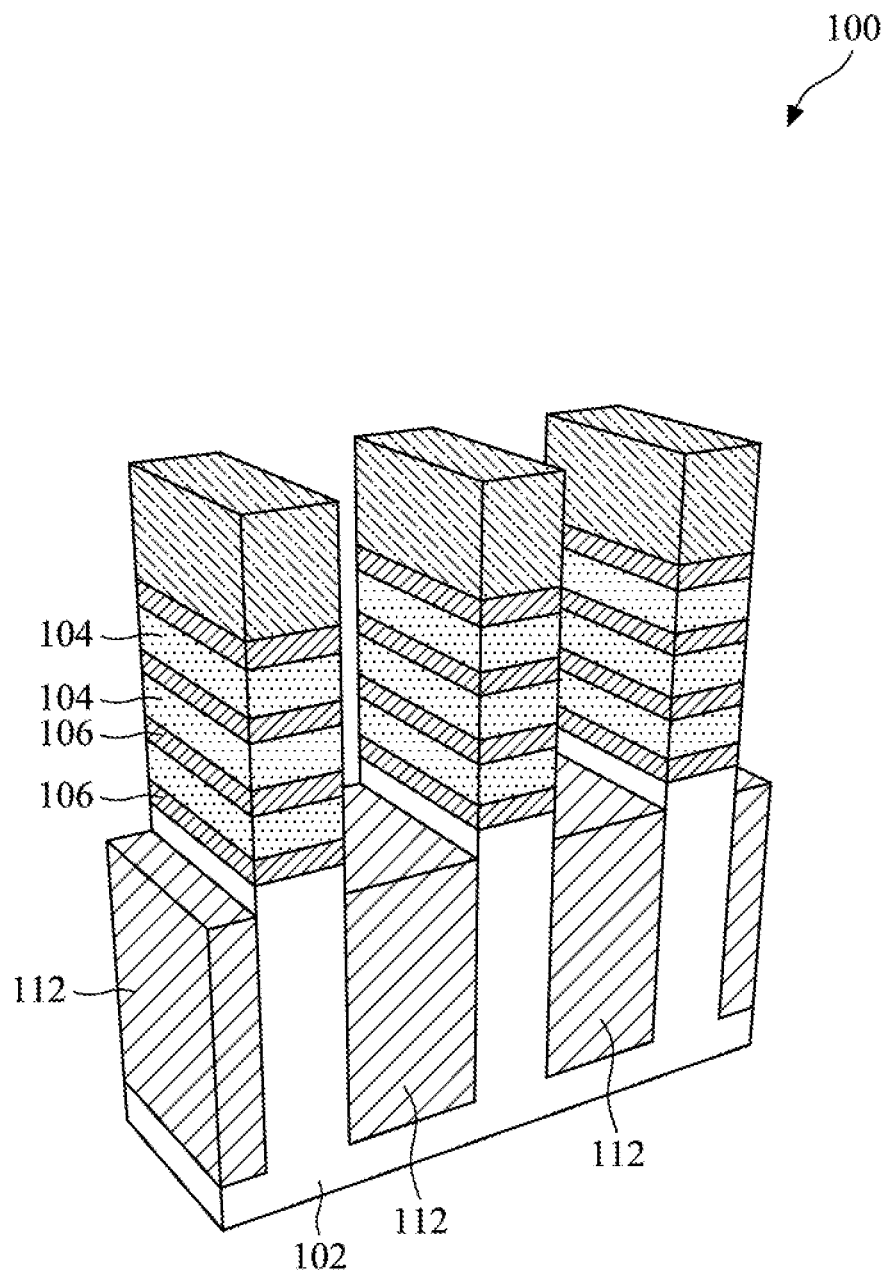
Figure 1D:
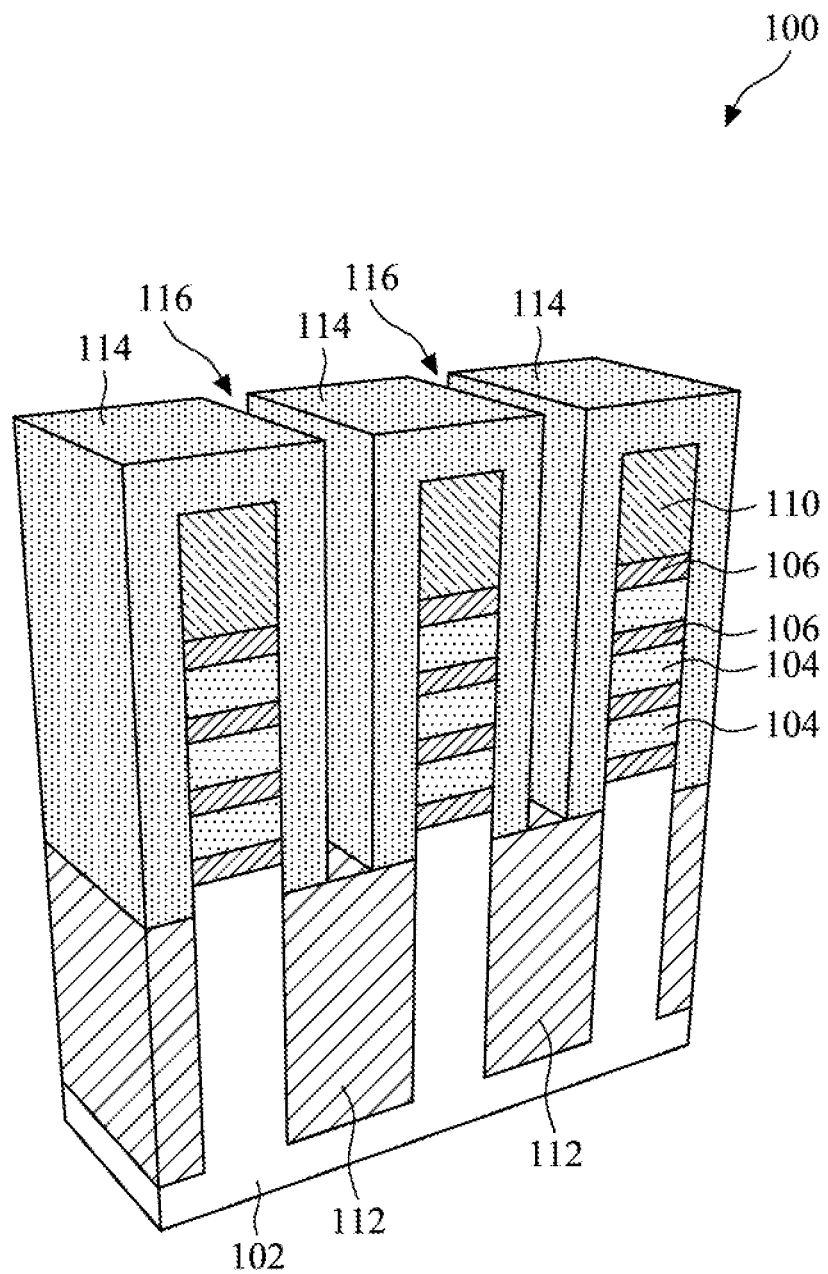
Figure 1E:
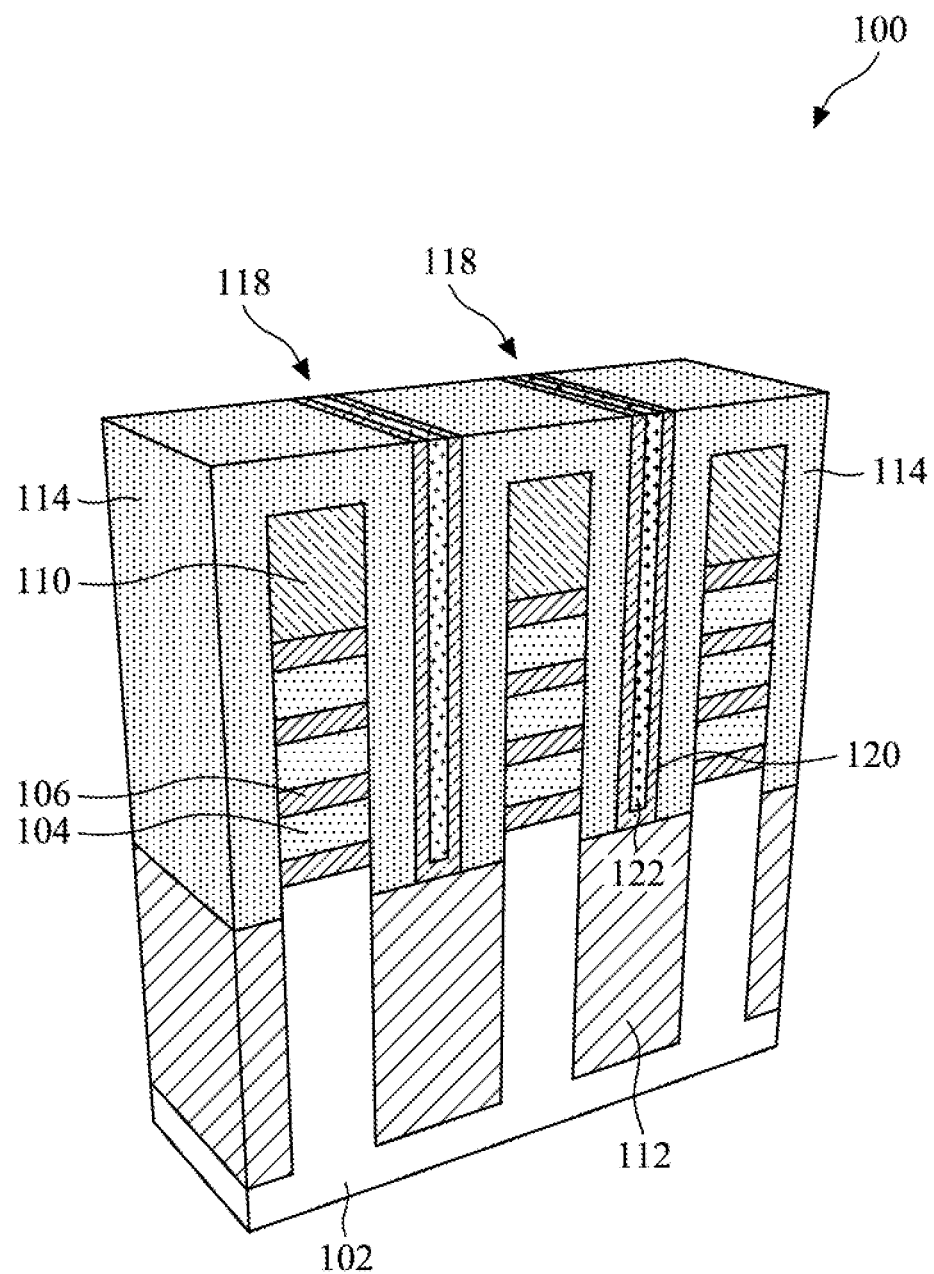
Figure 1F:
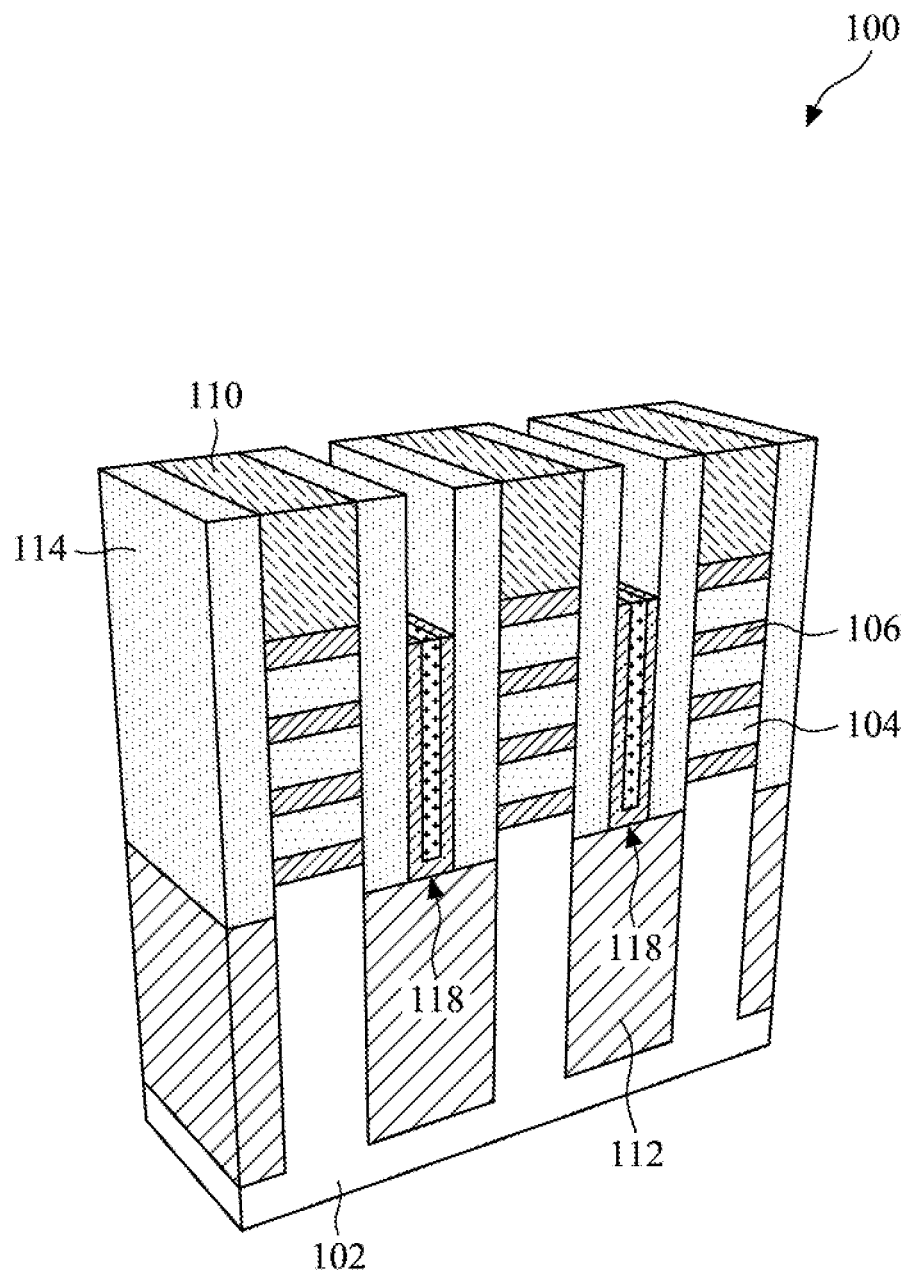
Figure 1G:
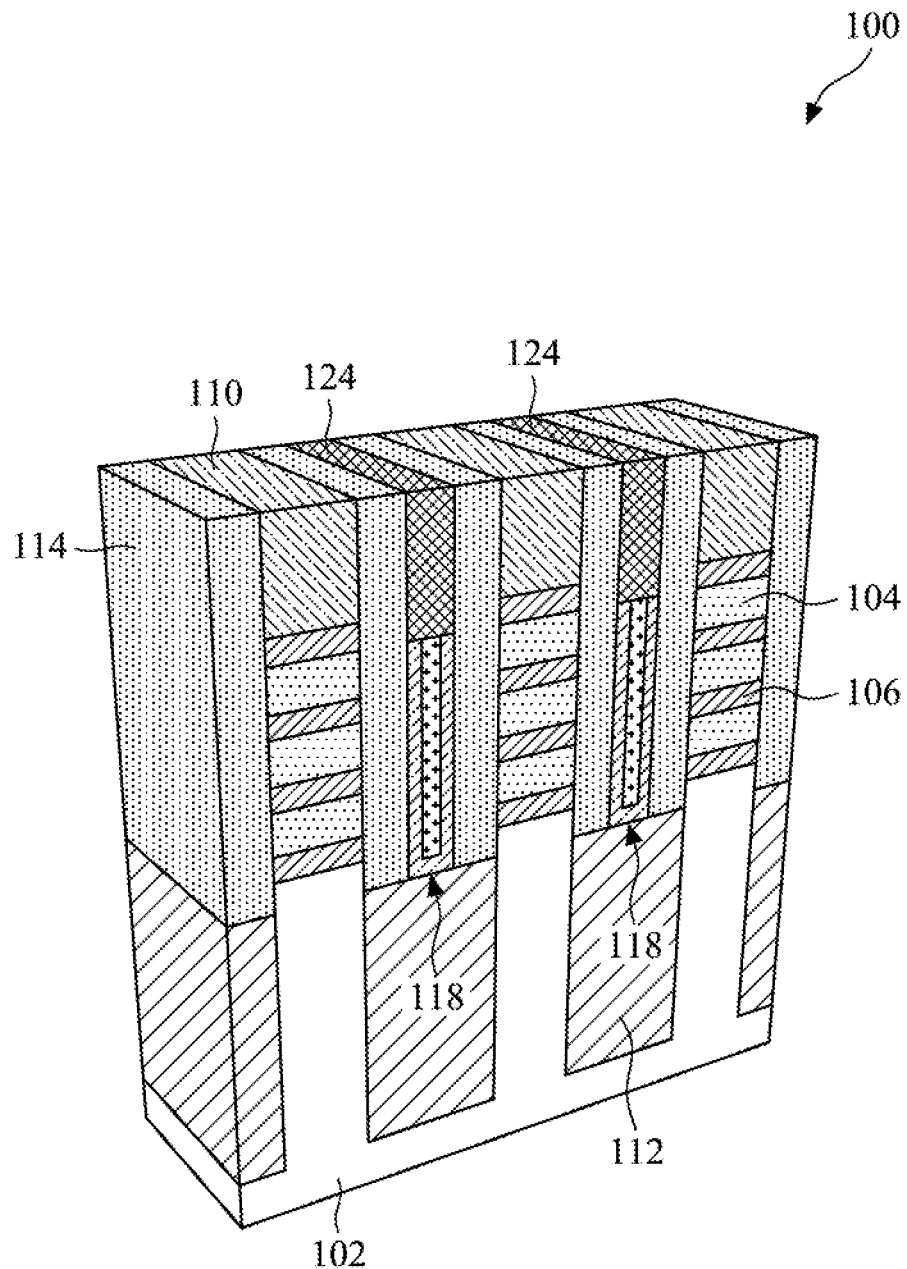
Figure 1H:
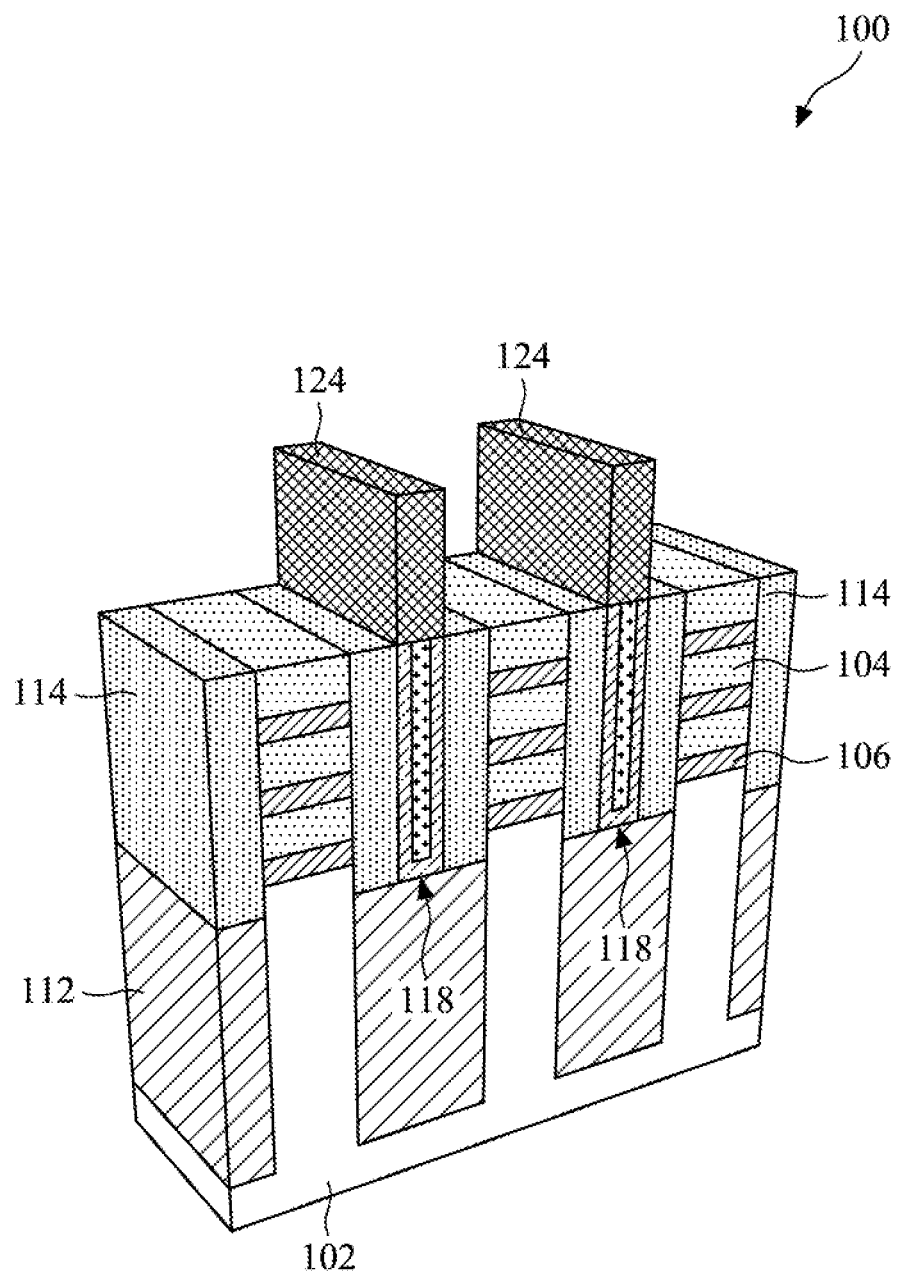
Figure 1I:
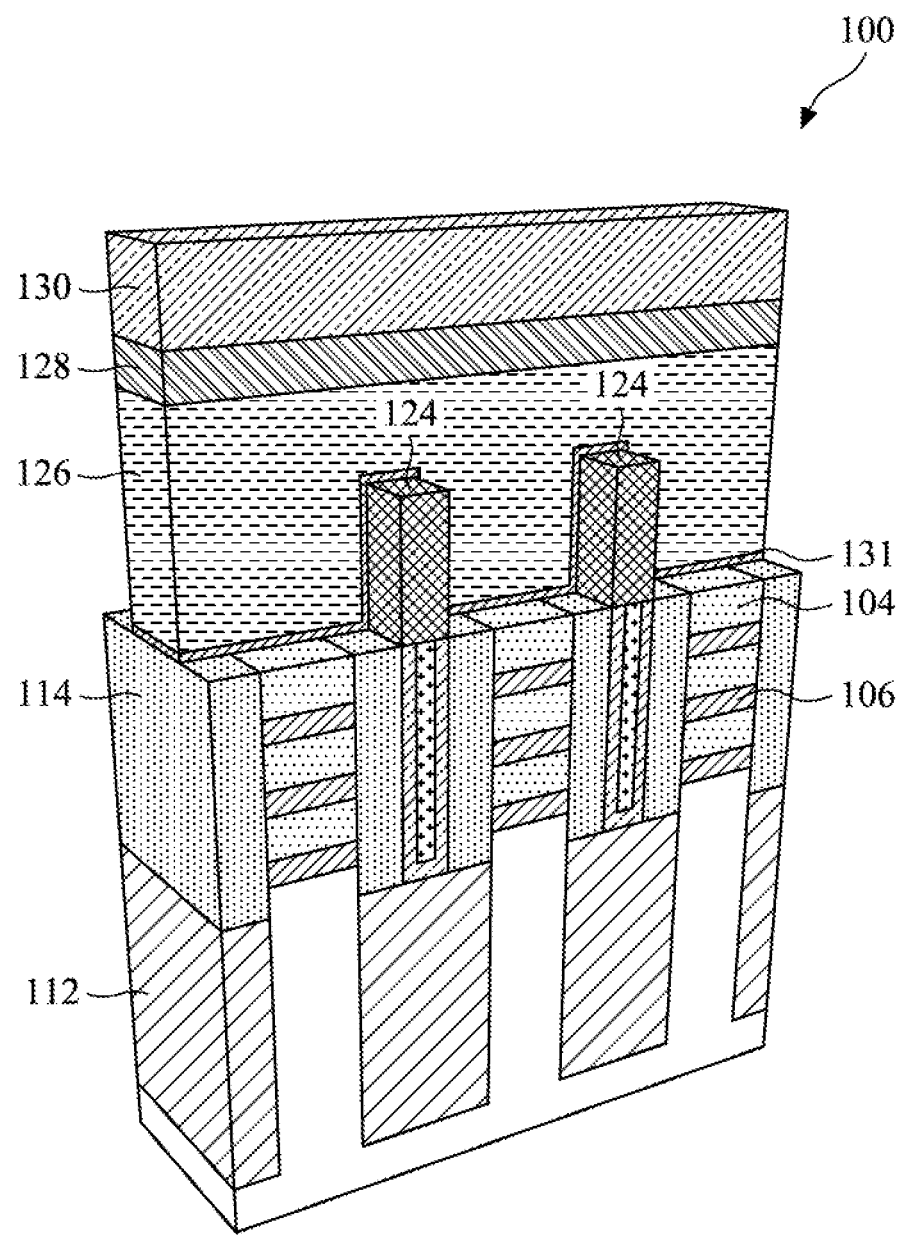
Figure 1J:
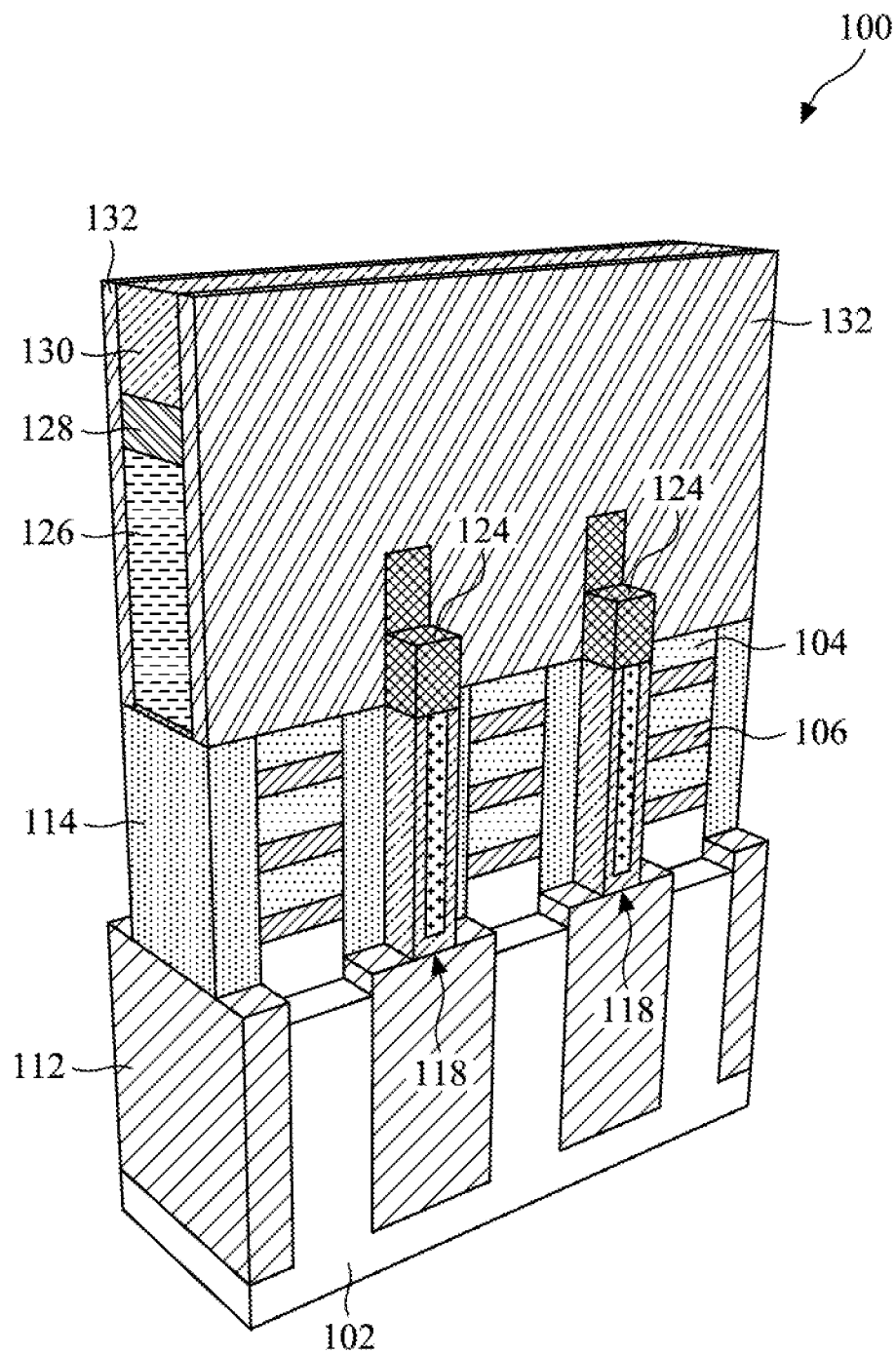
Figure 1K:
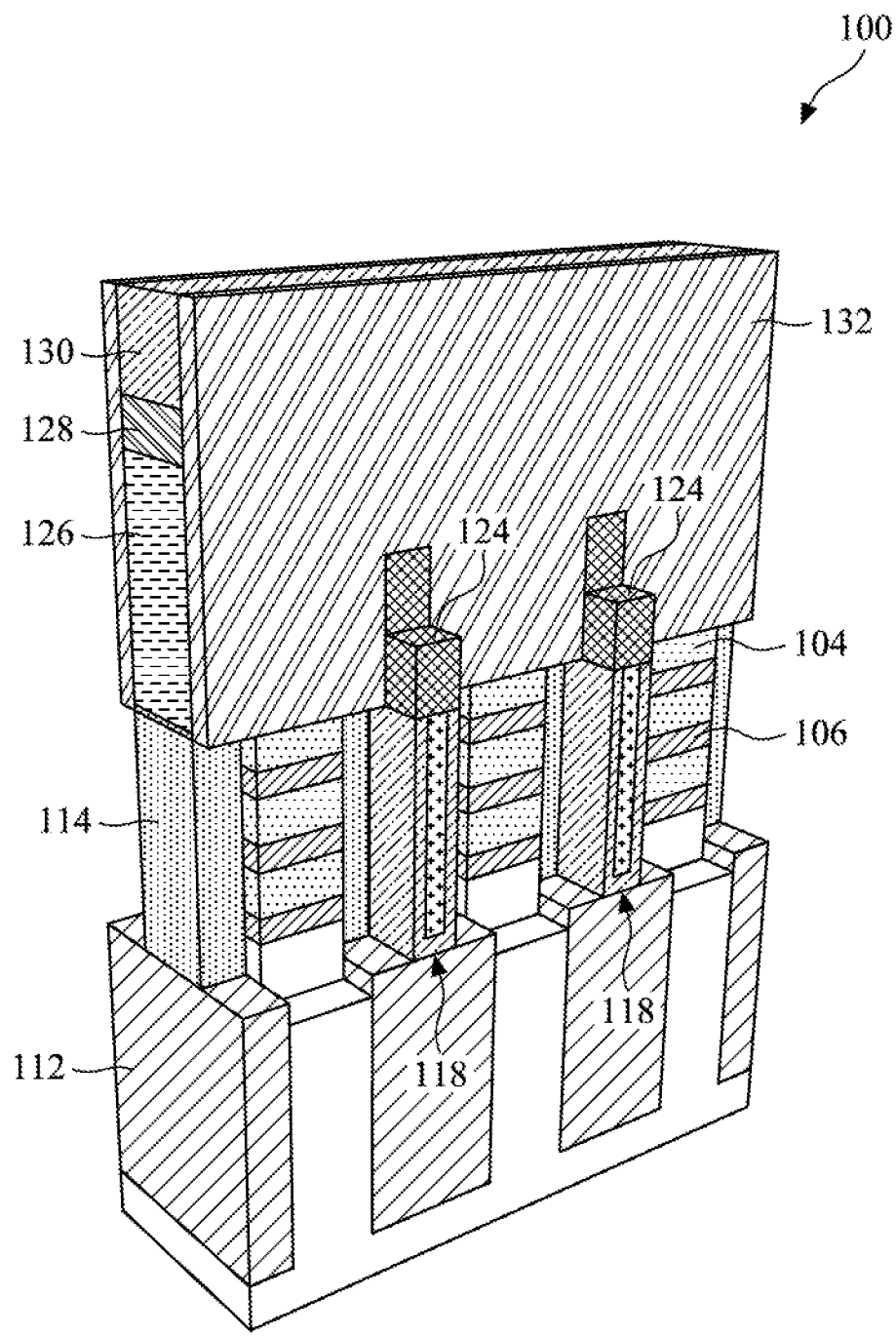
Figure 1L:
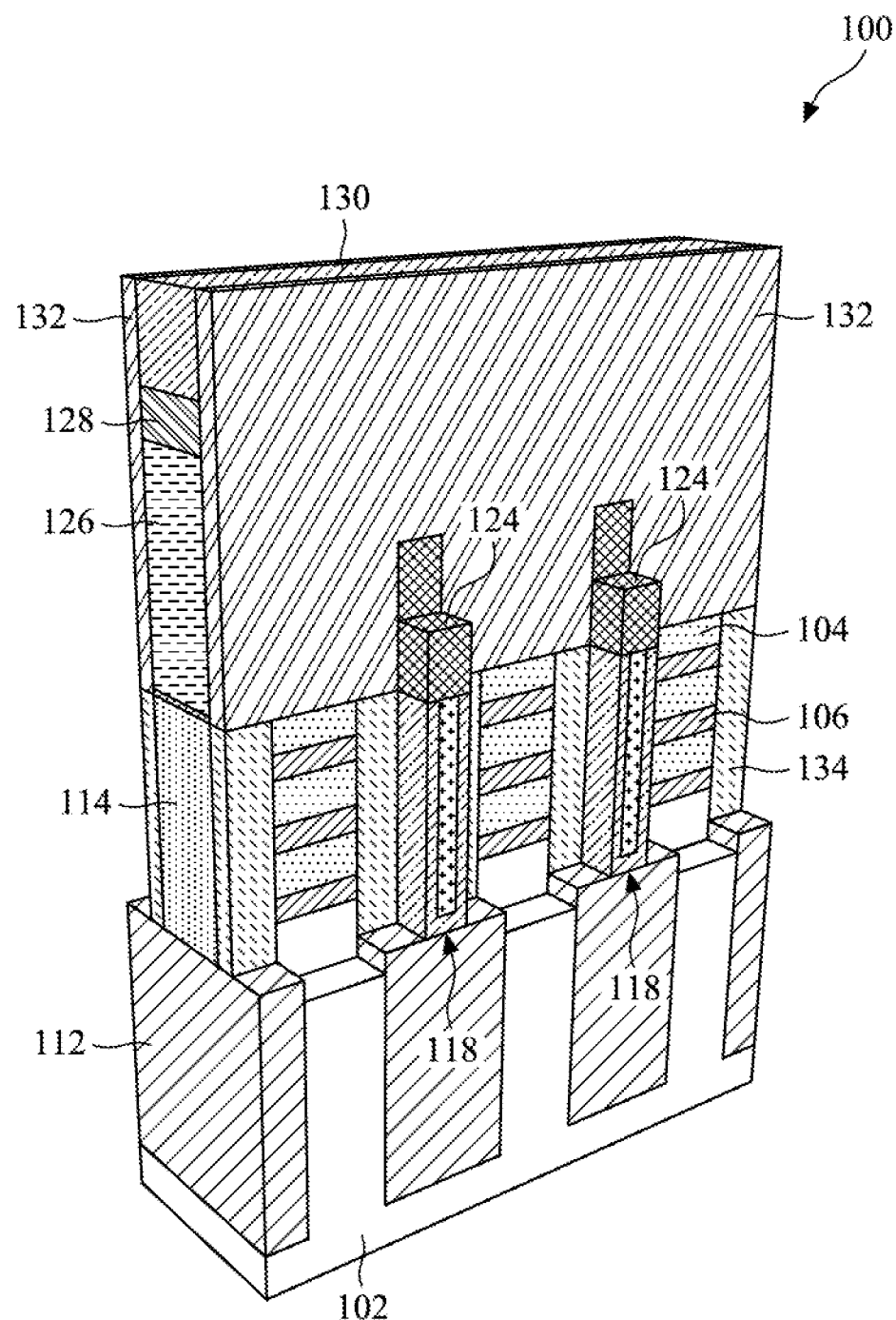
Figure 1M:
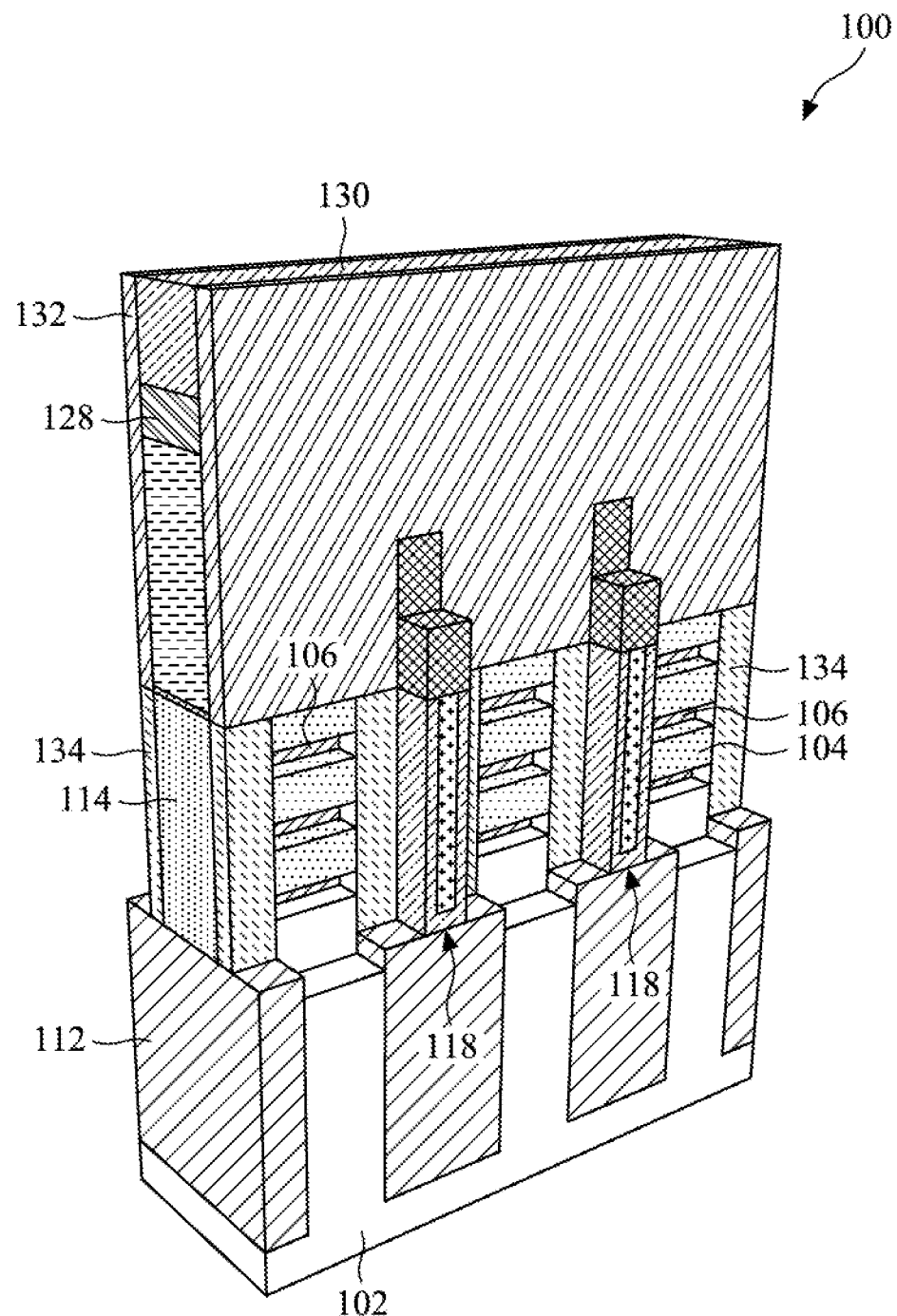
Figure 1N:
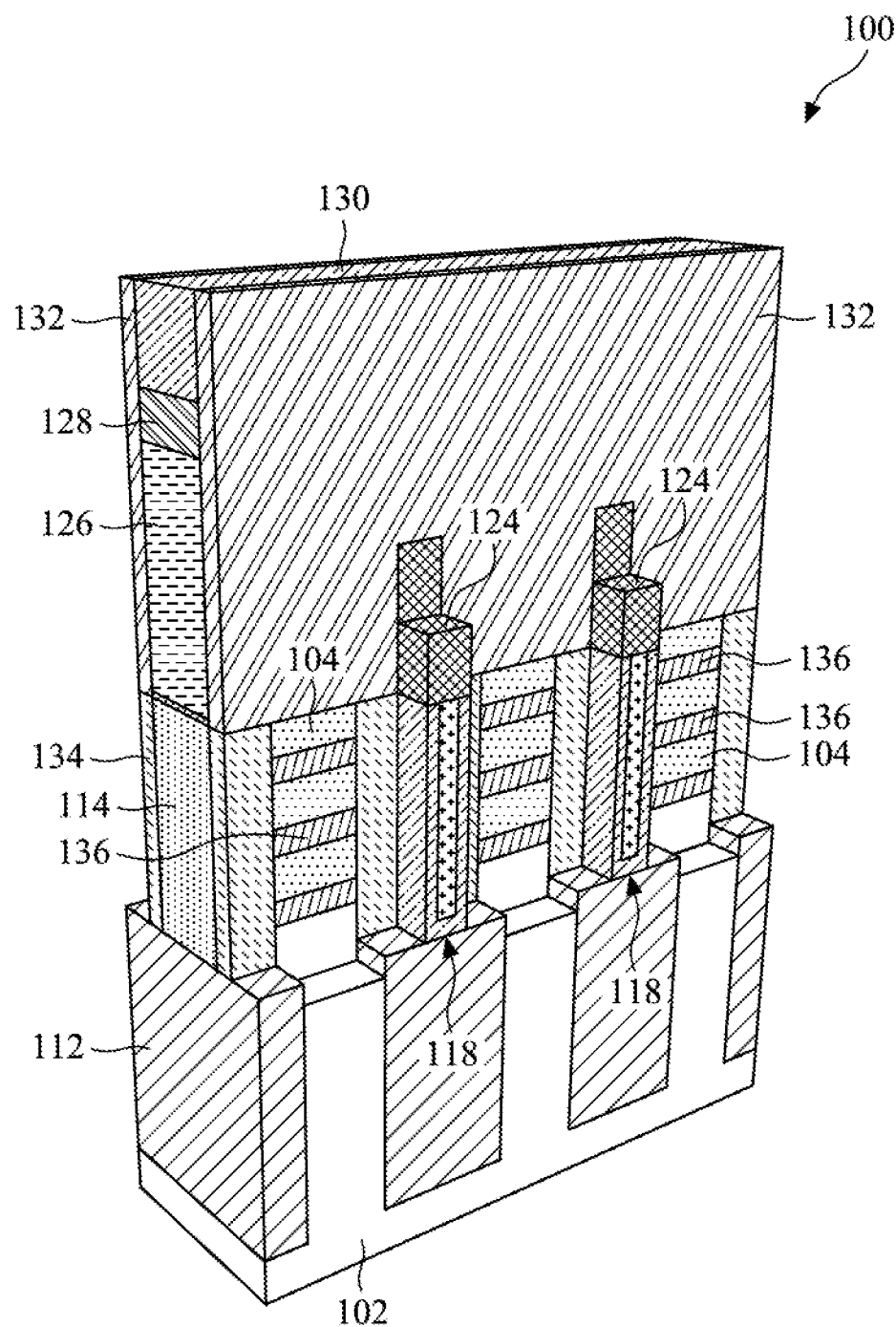
Figure 1O:
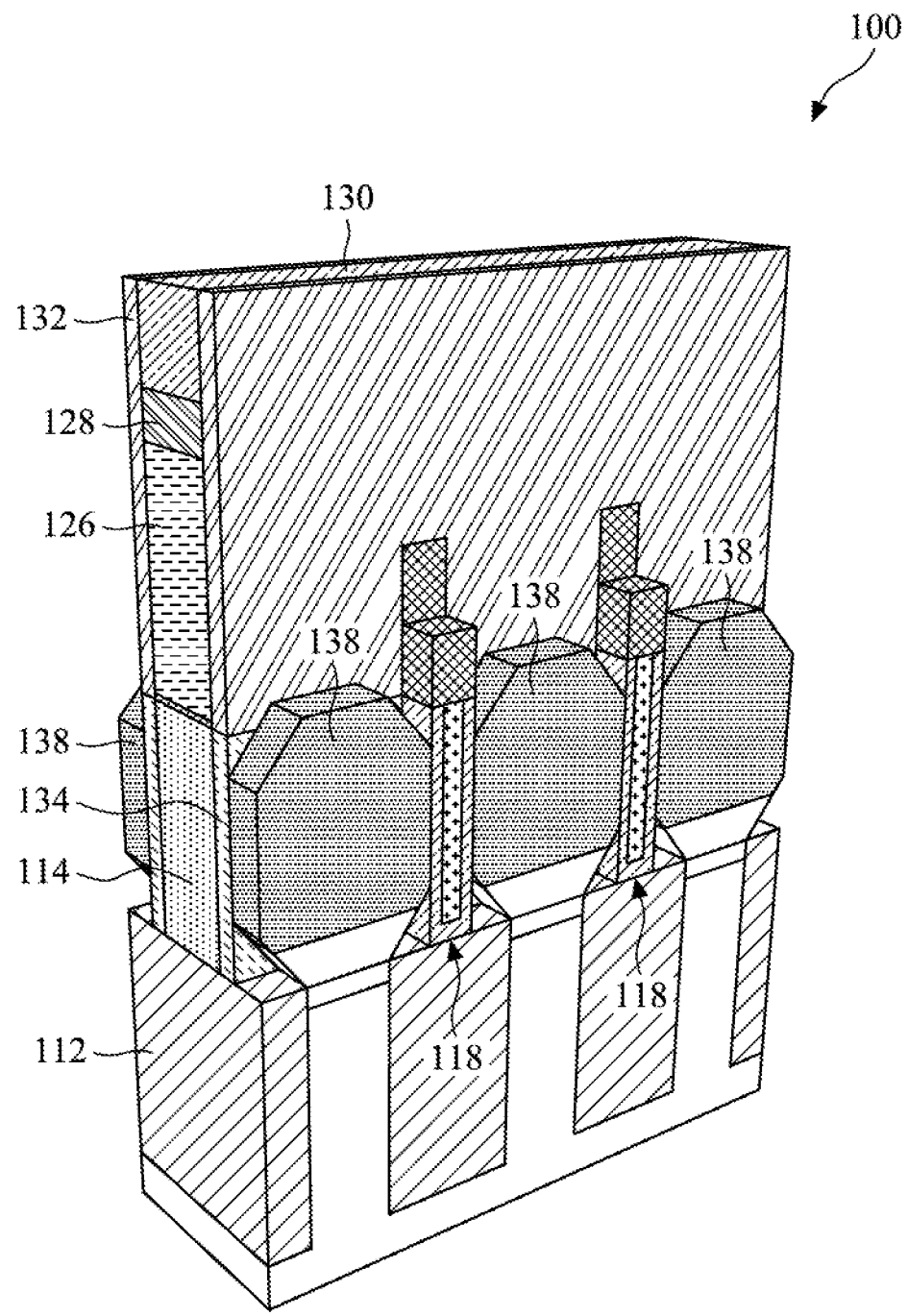
Figure 1P:
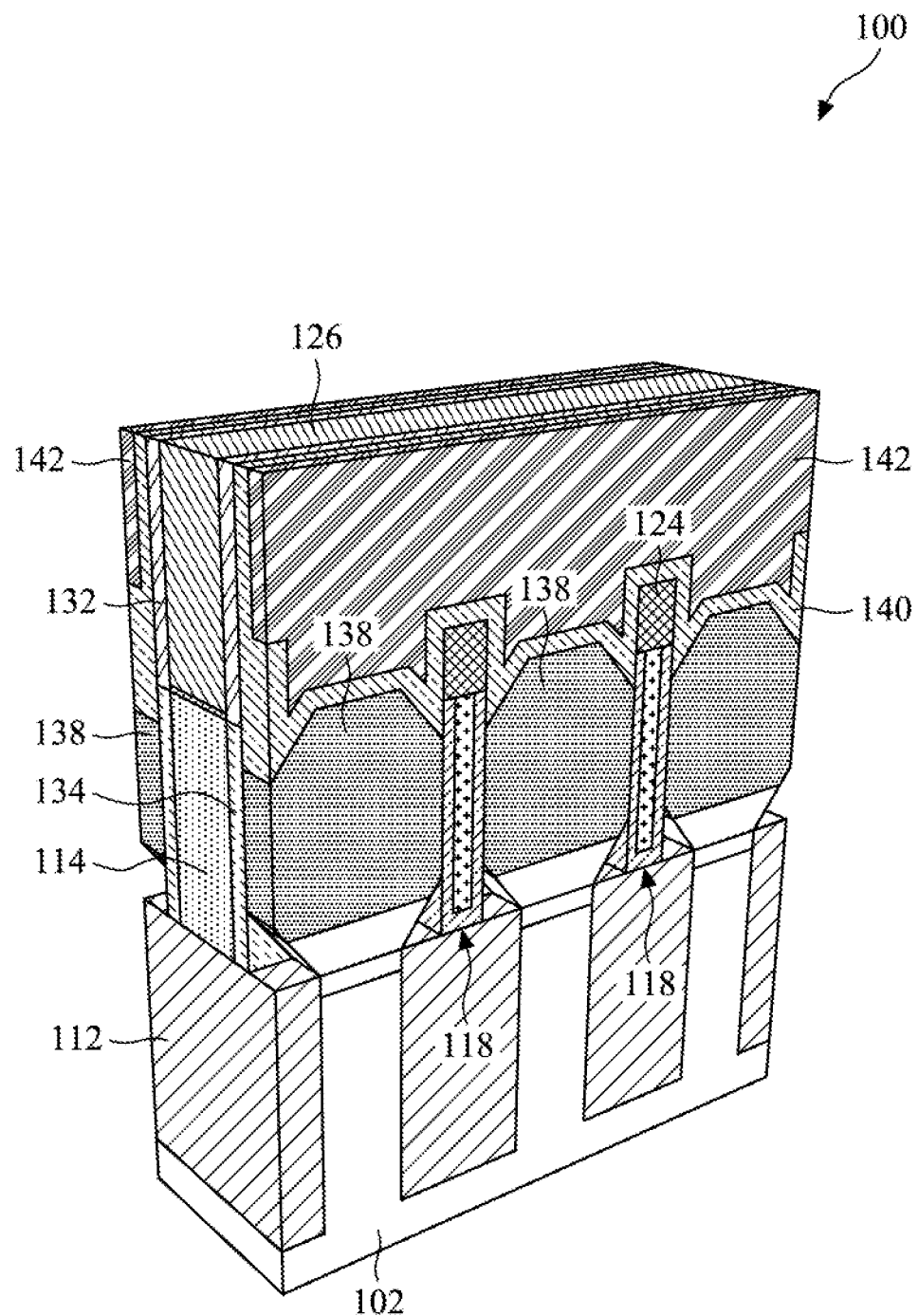
Figure 1Q:
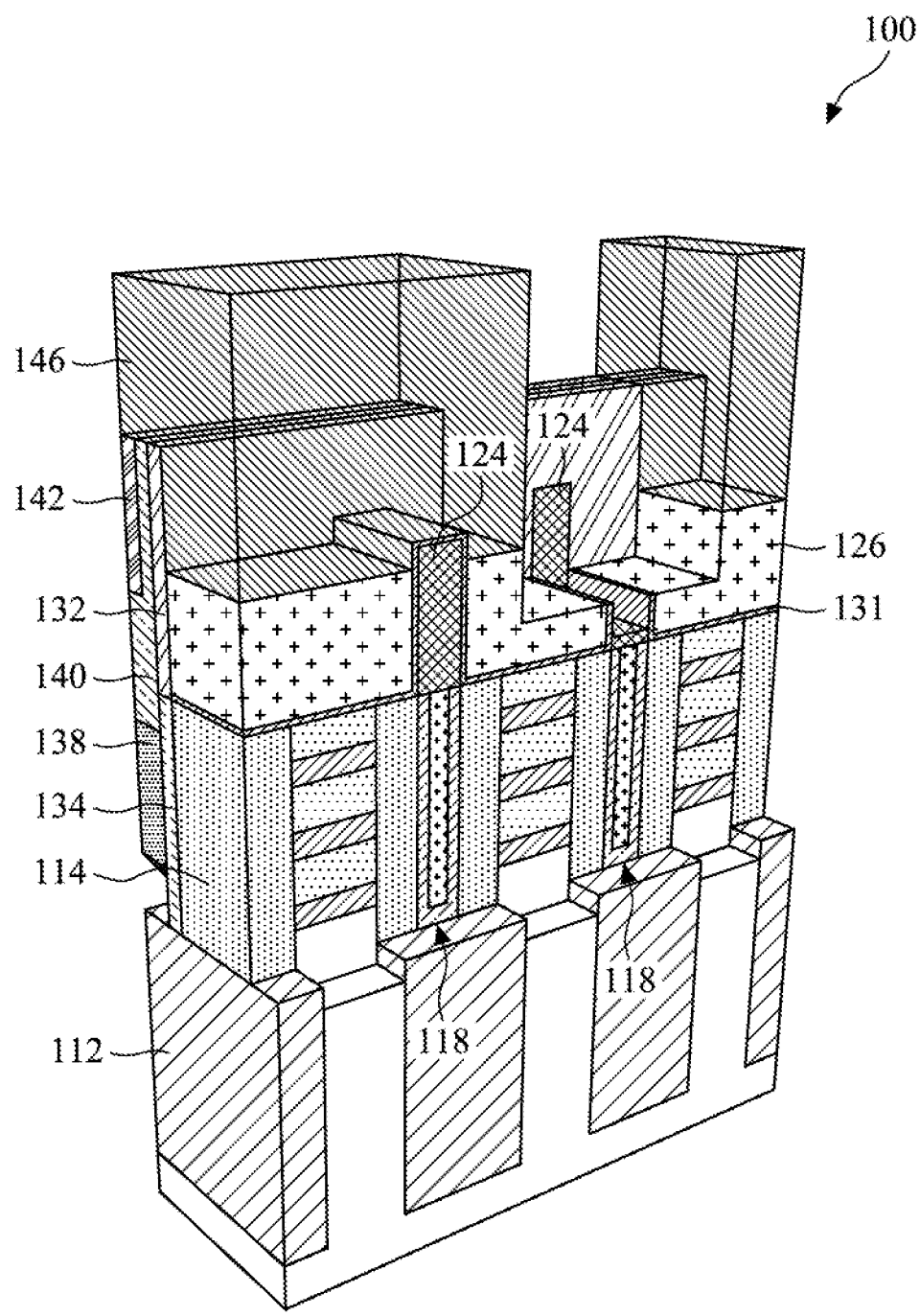
Figure 1R:
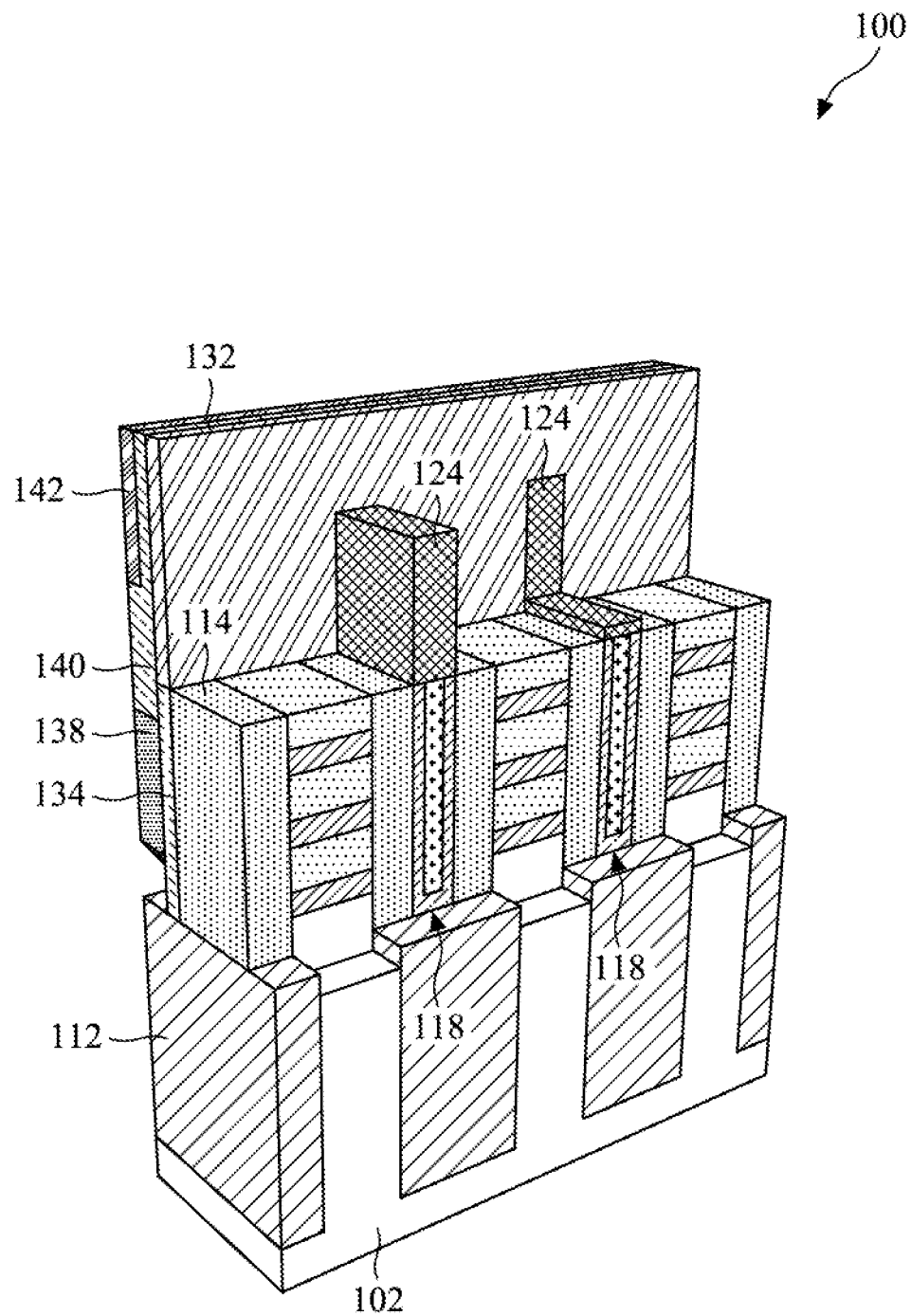
Figure 1S:
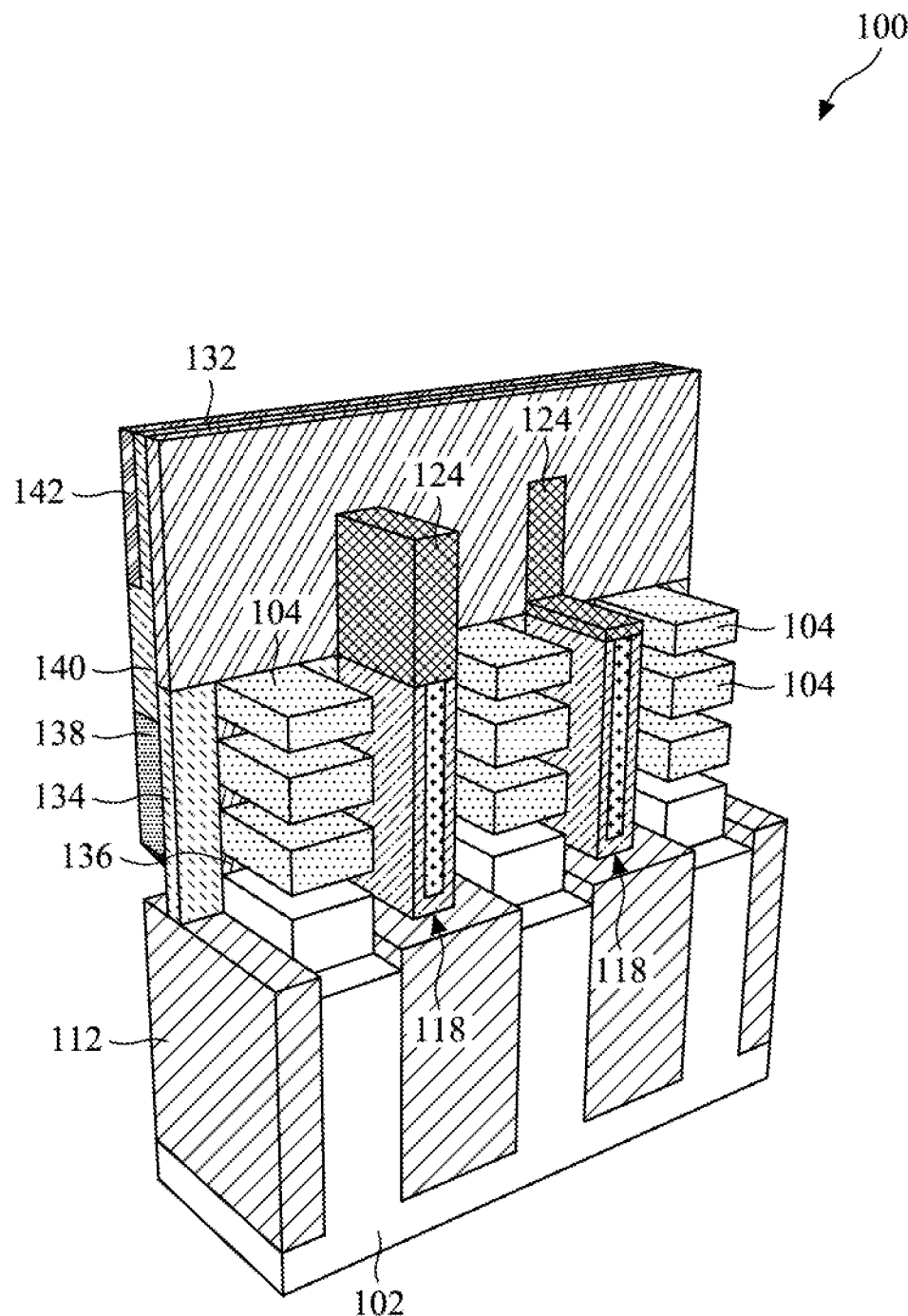
Figure 1T:
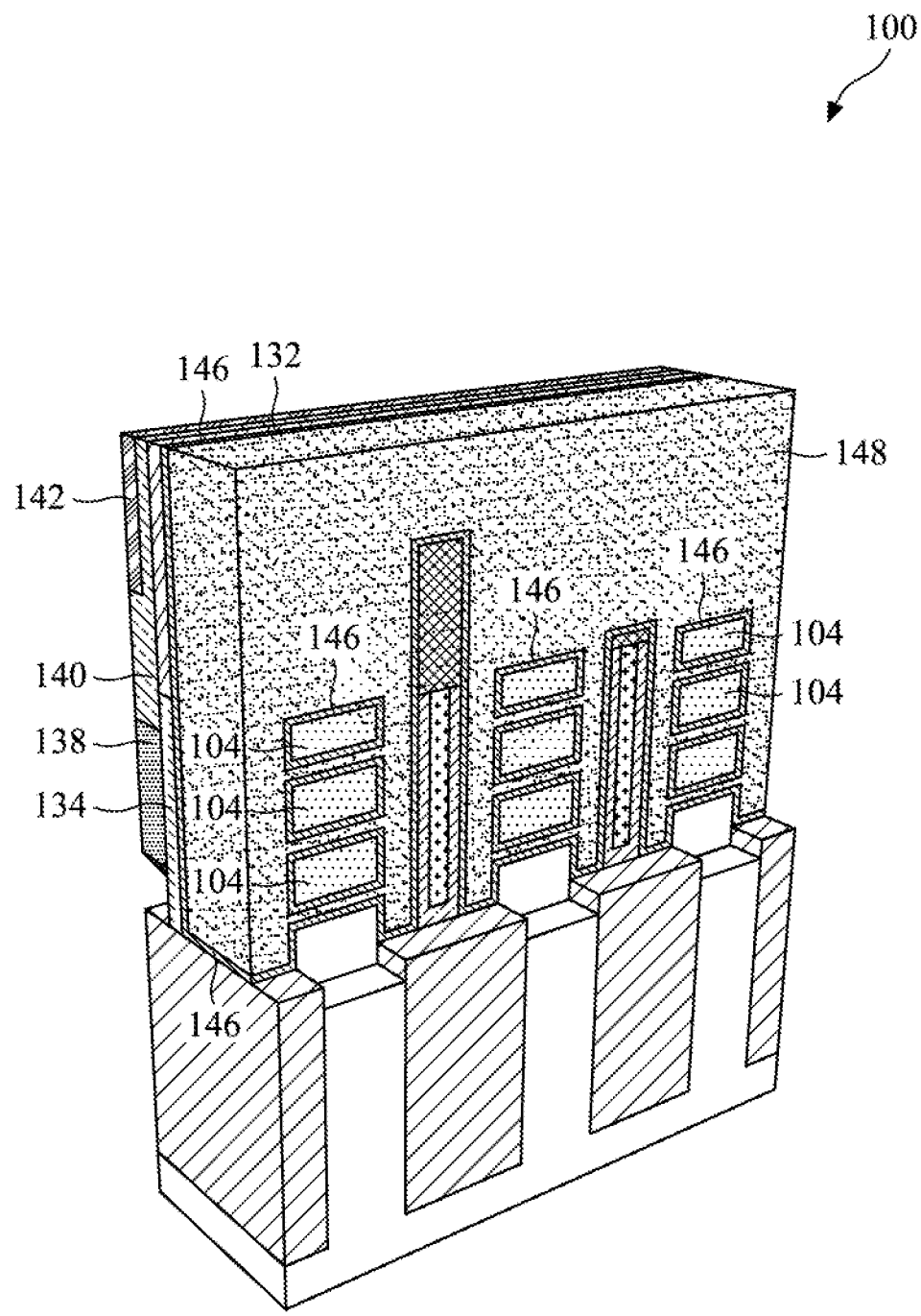
Figure 1U:
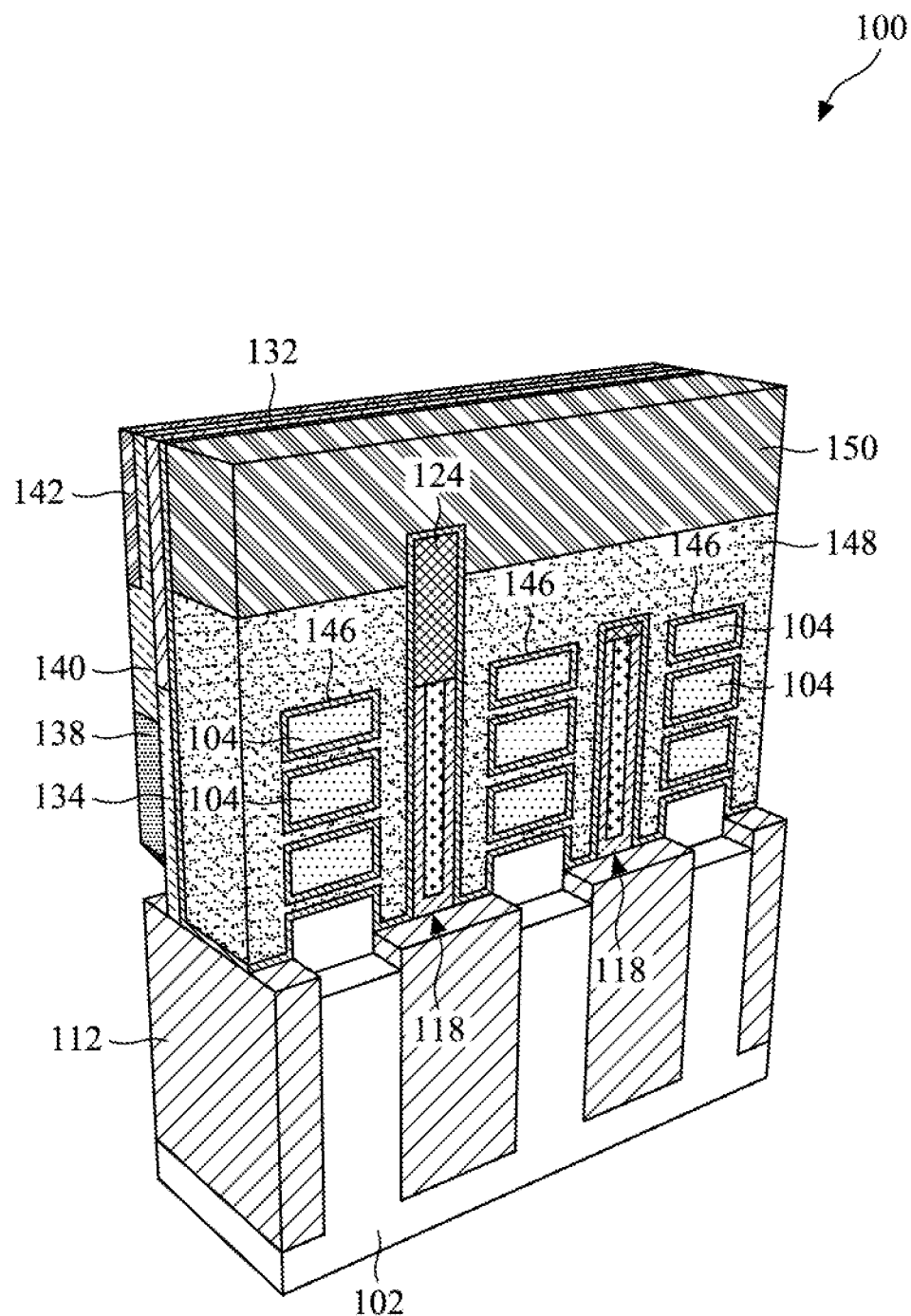
Figure 1V:
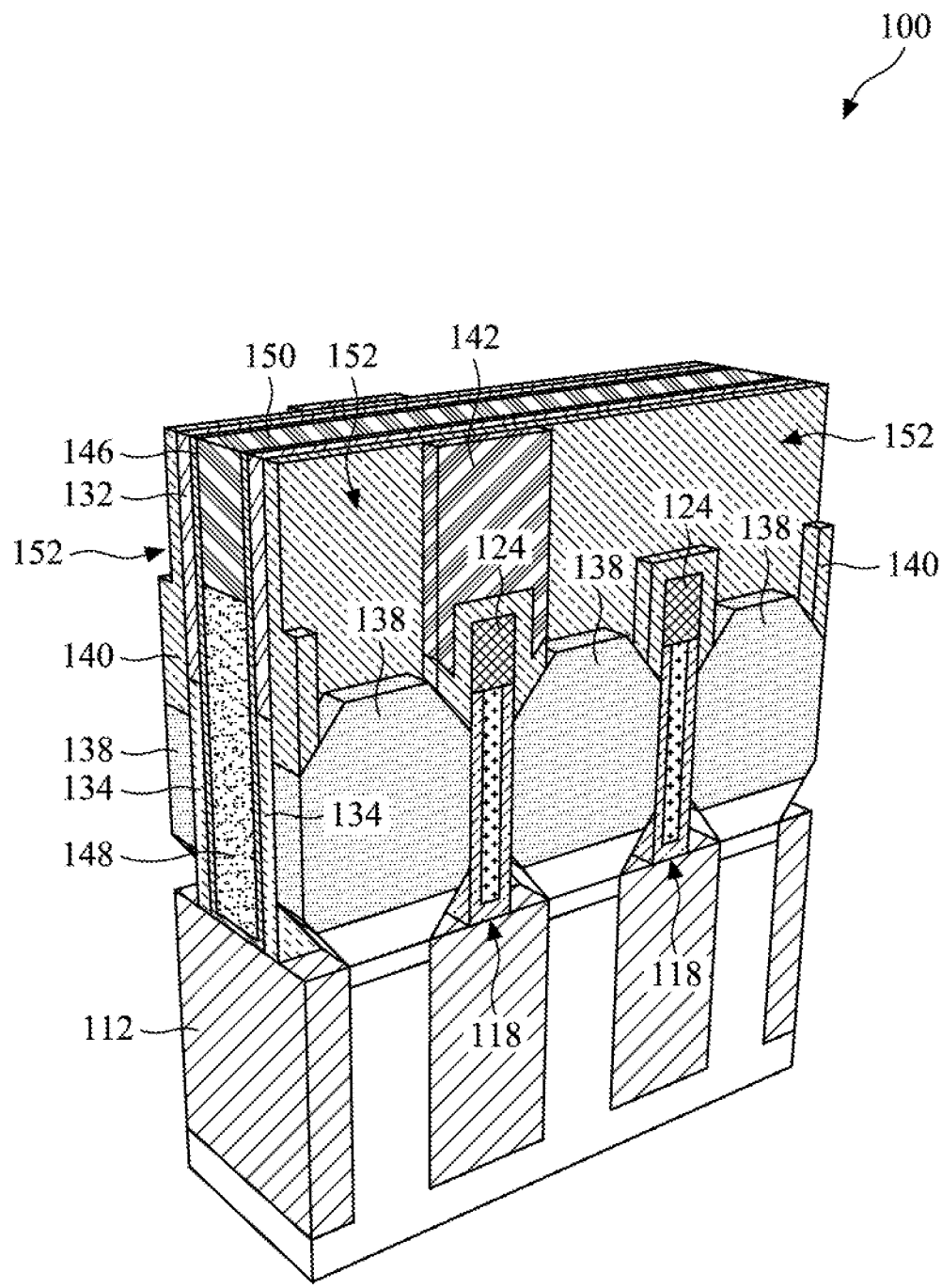
Figure 1W:
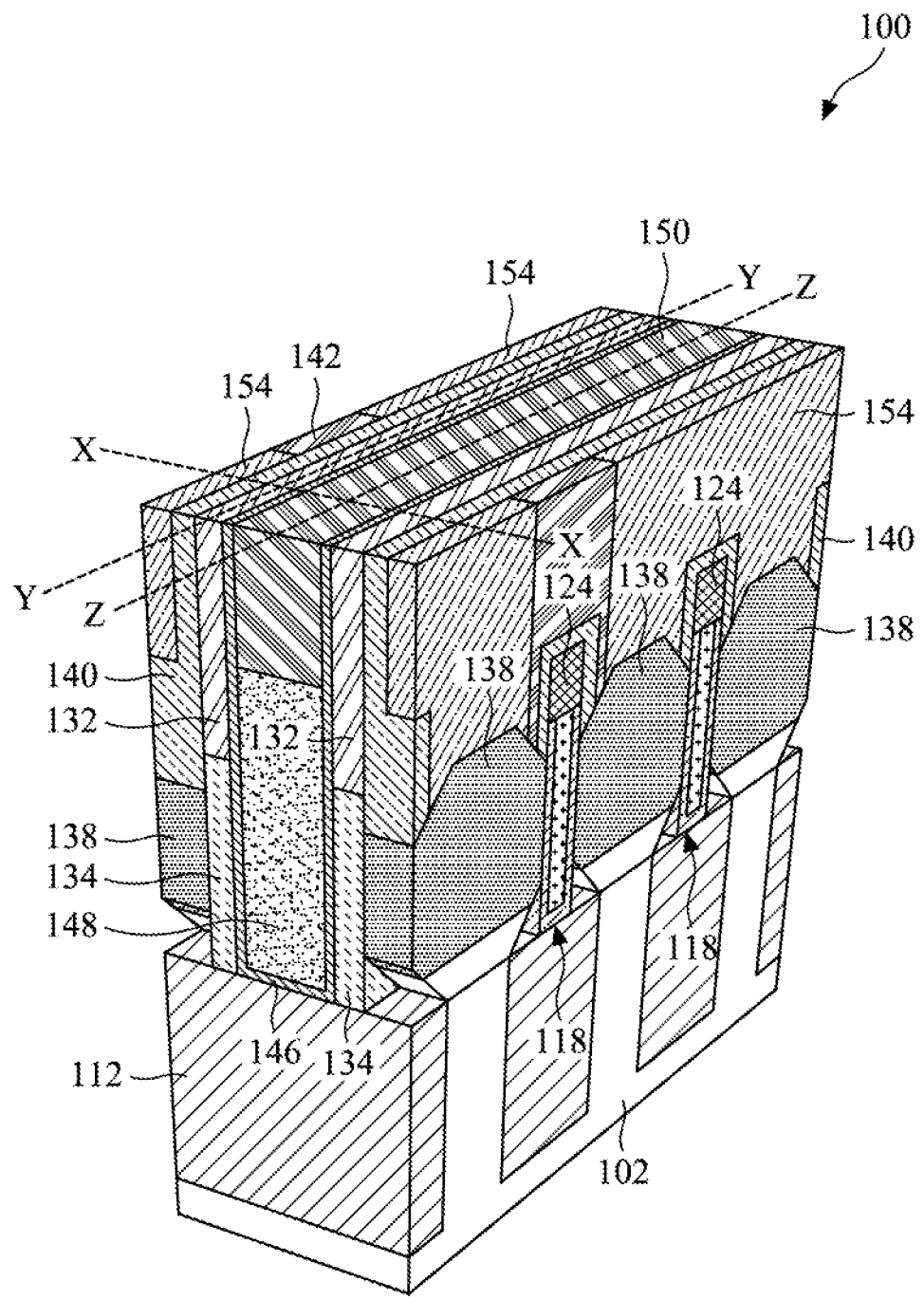

FIGS. 1A-1W are perspective views of an integrated circuit 100 at successive intermediate stages of processing, according to one embodiment. FIGS. 1A-1W illustrate an exemplary process for producing an integrated circuit that includes gate all around nanosheet transistors. FIGS. 1A-1W illustrate how these transistors can be formed in a simple and effective process in accordance with principles of the present disclosure. Other process steps and combinations of process steps can be utilized without departing from the scope of the present disclosure.

The gate all around transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the gate all around structure.

In FIG. 1A the integrated circuit 100 includes a semiconductor substrate 102. In one embodiment, the substrate 102 includes a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. In the example process described herein, the substrate 102 includes Si, though other semiconductor materials can be utilized without departing from the scope of the present disclosure.

The substrate 102 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. The substrate 102 may include various regions that have been suitably doped with impurities (e.g., p-type or n-type conductivity). The dopants are, for example boron ($BF_2$) for an n-type transistor and phosphorus for a p-type transistor.

The integrated circuit 100 includes a plurality of semiconductor nanosheets 104 or nanowires. The semiconductor nanosheets 104 are layers of semiconductor material. The semiconductor nanosheets 104 correspond to the channel regions of the gate all around transistors that will result from the process described. The semiconductor nanosheets 104 are formed over the substrate 102. The semiconductor nanosheets 104 may include one or more layers of Si, Ge, SiGe, GaAs, InSb, GaP, GaSb, InAlAs, InGaAs, GaSbP, GaAsSb or InP. In one embodiment, the semiconductor nanosheets 104 are the same semiconductor material as the substrate 102. Other semiconductor materials can be utilized for the semiconductor nanosheets 104 without departing from the scope of the present disclosure. In a primary non-limiting example described herein, the semiconductor nanosheets 104 and the substrate 102 are silicon.

The integrated circuit 100 includes a plurality of sacrificial semiconductor nanosheets 106 positioned between the semiconductor nanosheets 104. The sacrificial semiconductor nanosheets 106 include a different semiconductor material than the semiconductor nanosheets 104. In an example in which the semiconductor nanosheets 104 include silicon, the sacrificial semiconductor nanosheets 106 may include SiGe. In one example, the silicon germanium sacrificial semiconductor nanosheets 106 may include between 20% and 30% germanium, though other concentrations of germanium can be utilized without departing from the scope of the present disclosure. The concentration of germanium in the silicon germanium sacrificial semiconductor nanosheets 106 is selected to be different than the concentration of germanium in a subsequently formed SiGe sacrificial cladding. The compositions of the sacrificial semiconductor nanosheets 106 and the sacrificial cladding are selected to result in different etching characteristics. The purpose and benefits of this will be described in further detail below.

In one embodiment, the semiconductor nanosheets 104 and the sacrificial semiconductor nanosheets 106 are formed by alternating epitaxial growth processes from the semiconductor substrate 102. For example, a first epitaxial growth process may result in the formation of the lowest sacrificial semiconductor nanosheet 106 on the top surface of the substrate 102. A second epitaxial growth process may result in the formation of the lowest semiconductor nanosheet 104 on the top surface of the lowest sacrificial semiconductor nanosheet 106. A third epitaxial growth process results in the formation of the second lowest sacrificial semiconductor nanosheet 106 on top of the lowest semiconductor nanosheet 104. Alternating epitaxial growth processes are performed until a selected number of semiconductor nanosheets 104 and sacrificial semiconductor nanosheets 106 have been formed.

In FIG. 1A, there are three semiconductor nanosheets 104. However, in practice, there may be many more semiconductor nanosheets 104 than three. For example, each gate all around transistor may include between 3 and 20 semiconductor nanosheets 104. Other numbers of semiconductor nanosheets 104 can be utilized without departing from the scope of the present disclosure.

The vertical thickness of the semiconductor nanosheets 104 can be between 2 nm and 15 nm. The thickness of the sacrificial semiconductor nanosheets 106 can be between 5 nm and 15 nm. Other thicknesses and materials can be utilized for the semiconductor nanosheets 104 and the sacrificial semiconductor nanosheets 106 without departing from the scope of the present disclosure.

In one embodiment, the sacrificial semiconductor nanosheets 106 correspond to a first sacrificial epitaxial semiconductor region having a first semiconductor composition. In subsequent steps, the sacrificial semiconductor nanosheets 106 will be removed and replaced with other materials and structures. For this reason, the nanosheets 106 are described as sacrificial.

In FIG. 1B, trenches 108 have been formed in the sacrificial semiconductor nanosheets 106, the semiconductor nanosheets 104, and in the substrate 102. The trenches can be formed by depositing a hard mask layer 110 on the top sacrificial semiconductor nanosheet 106. The hard mask layer 110 is patterned and etched using standard photolithography processes. After the hard mask layer 110 has been patterned and etched, the sacrificial semiconductor nanosheets 106, the semiconductor nanosheets 104, and the substrate 104 are etched at the locations that are not covered by the hard mask layer 110. The etching process results in formation of the trenches 108. The etching process can include multiple etching steps. For example, a first etching step can etch the top sacrificial semiconductor nanosheet. A second etching step can etch the top semiconductor nanosheet 104. These alternating etching steps can repeat until all of the sacrificial semiconductor nanosheets 106 and semiconductor nanosheets 104 and the etched at the exposed regions. The final etching step may etch the substrate 102. In other embodiments, the trenches 108 may be formed in a single etching process.

The trenches 108 define three columns or stacks semiconductor nanosheets 104 and sacrificial semiconductor nanosheets 106. Each of these columns or stacks corresponds to a separate gate all around transistor that will eventually result from further processing steps described herein. In particular, the semiconductor nanosheets 104 in each column or stack will correspond to the channel regions of a particular gate all around nanosheet transistor.

The hard mask layer 110 can include one or more of aluminum, AlO, SiN, or other suitable materials. The hard mask layer 110 can have a thickness between 5 nm and 50 nm. The hard mask layer 110 can be deposited by a PVD process, an ALD process, a CVD process, or other suitable deposition processes. The hard mask layer 110 can have other thicknesses, materials, and deposition processes without departing from the scope of the present disclosure.

In FIG. 1C, shallow trench isolation regions have been formed in the trenches 108. The shallow trench isolation regions can be formed by depositing a dielectric material in the trenches 108 and by recessing the deposited dielectric material so that a top surface of the dielectric material is lower than the lowest sacrificial semiconductor nanosheet 106.

The shallow trench isolation regions 112 can be utilized to separate individual transistors or groups of transistors groups of transistors formed in conjunction with the semiconductor substrate 102. The dielectric material for the shallow trench isolation regions 112 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma enhanced-CVD or flowable CVD. Other materials and structures can be utilized for the shallow trench isolation regions 112 without departing from the scope of the present disclosure.

In FIG. 1D, a sacrificial semiconductor cladding 114 has been deposited on the on the sides of the semiconductor nanosheets 104 and the sacrificial semiconductor nanosheets 106 and on the hard mask layer 110. The sacrificial semiconductor cladding 114 defines gaps 116 between claddings 114 of adjacent columns of semiconductor nanosheets. The sacrificial semiconductor cladding 114 can be formed by an epitaxial growth from the semiconductor nanosheets 104, the sacrificial semiconductor nanosheets 106, and the hard mask layer 110. Alternatively, the sacrificial semiconductor cladding 114 can be deposited by a chemical vapor deposition (CVD) process. Other processes can be utilized for depositing the sacrificial semiconductor cladding 114 without departing from the scope of the present disclosure.

In one embodiment, the sacrificial semiconductor cladding includes SiGe. In particular, the sacrificial semiconductor cladding 114 includes SiGe with a different concentration of germanium than the sacrificial semiconductor nanosheets 106. As set forth previously, in one example, the sacrificial semiconductor nanosheets 106 include between 10% and 20% germanium. In one example, the concentration of germanium in the sacrificial semiconductor cladding 114 is between 30% and 50%. In other words, the concentration of germanium in the semiconductor cladding 114 is 20% to 40% higher than in the sacrificial nanosheets 106. This difference in composition results in the ability to selectively etch the semiconductor cladding 114 at a different rate than the sacrificial nanosheets 106. The sacrificial semiconductor cladding 114 can include other concentrations, materials, or compositions without departing from the scope of the present disclosure.

In FIG. 1E, hybrid fin structures 118 have been formed in the gaps 116 between the sacrificial semiconductor claddings 114. The hybrid fin structures 118 include a dielectric layer 120 and a dielectric layer 122. In one embodiment, the dielectric layer 120 includes silicon nitride. In one embodiment, the dielectric layer 122 includes silicon oxide. The dielectric layer 120 can be deposited on the shallow trench isolation 112 and on the sidewalls of the sacrificial semiconductor cladding 114. The dielectric layer 122 can be deposited on the dielectric layer 120 in the trenches 116 filling the remaining space between the sacrificial semiconductor claddings 114. The dielectric layer 120 in the dielectric layer 122 can be deposited by CVD, by atomic layer deposition (ALD), or by other suitable deposition processes. After deposition of the dielectric layers 120 and 122, the hybrid fin structures 118 are planarized by a chemical mechanical planarization (CMP) process. Other materials and deposition processes can be utilized to form the hybrid fin structures 118 without departing from the scope of the present disclosure.

In FIG. 1F a first etching process has been performed to remove the sacrificial semiconductor cladding 114 from on top of the hard mask layer 110. The first etching process can include an anisotropic etch that selectively etches in the downward direction. The first etching process can include a wet etch or dry etch. The first etch can be performed in the absence of a mask. The first etching process exposes the top surface of the hard mask layer 110.

In FIG. 1F a second etching process has been performed to recess the top surface of the hybrid fin structures 118. In particular, a timed etch is performed to reduce the top surface of the hybrid fin structures 118 to a level lower than the bottom of the hard mask layer 110. The second etching process can include a wet etch, dry etch, or any suitable etch for recessing the hybrid fin structures 118 to a selected depth.

In FIG. 1G, a high-K dielectric layer 124 has been deposited on the hybrid fin structures 118. The high-K dielectric layer 124 can include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K dielectric layer 124 may be formed by CVD, ALD, or any suitable method. The planarization process, such as a CMP process, has been performed to planarize the top surface of the high-K dielectric layer 124. The high-K dielectric layer 124 may be termed a helmet layer for the hybrid fin structures 118. Other processes and materials can be utilized for the high-K dielectric layer 124 without departing from the scope of the present disclosure.

In FIG. 1H an etching process has been performed to remove the hard mask 110 and to recess the sacrificial semiconductor cladding 114 and to remove the top sacrificial semiconductor nanosheet 106 from each nanosheet stack. The etching process can be performed in one or more steps. The one or more steps selectively etch the hard mask and the materials of the sacrificial semiconductor cladding 114 and the sacrificial semiconductor nanosheets 106 with respect to the material of the high-K dielectric layer 124. Accordingly, in FIG. 1H the high-K dielectric layer 124 remains protruding above substantially unchanged while other layers have been recessed or removed. The one or more etching steps can include wet etches, dry etches, timed etches, or other types of etching processes.

In FIG. 1I a layer of polysilicon 126 has been deposited on the top surfaces of the sacrificial semiconductor cladding 114, the top semiconductor nanosheet 104, and on the high-K dielectric layer 124. The layer of polysilicon 126 can have a thickness between 20 nm and 100 nm. The layer polysilicon 126 can be deposited by an epitaxial growth, a CVD process, a physical vapor deposition (PVD) process, or an ALD process. Other thicknesses and deposition processes can be used for depositing the layer polysilicon 126 without departing from the scope of the present disclosure.

In FIG. 1I a dielectric layer 128 has been deposited on the layer of polysilicon 126. A dielectric layer 130 has been formed on the dielectric layer 128. In one example, the dielectric layer 128 includes silicon nitride. In one example, the dielectric layer 130 includes silicon oxide. The dielectric layers 128 and 130 can be deposited by CVD. The dielectric layer 128 can have a thickness between 5 nm and 15 nm. The dielectric layer 130 can have a thickness between 15 nm and 50 nm. Other thicknesses, materials, and deposition processes can be utilized for the dielectric layers 128 and 130 without departing from the scope of the present disclosure.

The dielectric layers 128 and 130 have been patterned and etched to form a hard mask for the layer of polysilicon 126. The dielectric layers 128 and 130 can be patterned and etched using standard photolithography processes. After the dielectric layers 128 and 130 have been patterned and etched to form the hard mask, the layer polysilicon 126 is etched so that only the polysilicon directly below the dielectric layers 128 and 130 remains. The result is a polysilicon fin.

In one embodiment, a thin dielectric layer 131 can be deposited prior to deposition of the layer of polysilicon 126. The thin dielectric layer 131 can be between 1 nm and 5 nm in thickness. The thin dielectric layer 131 can include silicon oxide. Other materials, deposition processes, and thicknesses can be utilized for the thin dielectric layer 131 without departing from the scope of the present disclosure.

In FIG. 1J, a gate spacer layer 132 has been deposited on the exposed top surfaces of the sacrificial semiconductor cladding 114 and the top semiconductor nanosheet 104, as well as on the sidewalls of the layer of polysilicon 126 and the dielectric layers 128 and 130. In one example, the gate spacer layer 132 includes SiCON. The gate spacer layer 132 can be deposited by CVD, PVD, or ALD. Other materials and deposition processes can be utilized for the gate spacer layer 132 without departing from the scope of the present disclosure.

The gate spacer layer 132 acts as a mask for etching portions of the sacrificial semiconductor cladding 114, the semiconductor nanosheets 104, and the sacrificial semiconductor nanosheets 106 in preparation for depositing a growing source and drain regions as will be set forth in further detail below. After formation of the gate spacer layer 132, and an isotropic etching process is performed that selectively etches in the downward direction. The portions of the sacrificial semiconductor cladding 114, the semiconductor nanosheets 104, and the sacrificial semiconductor nanosheets 106 that are not directly below the gate spacer layer 132 and the polysilicon 126 are etched. The result is that a portion of the shallow trench isolation regions 126 and the substrate 102 are exposed.

The high-K dielectric layer 124 is etched at a comparatively slow rate with respect to the various semiconductor layers. The result is that only about half of the exposed high-K dielectric layer 124 is etched. Accordingly, the hybrid fin structures 118 below the high-K dielectric 124 are not substantially etched during the etching process.

In FIG. 1K is etching process has been performed to recess the sacrificial semiconductor cladding 114 with respect to the sacrificial semiconductor nanosheets 106 and the semiconductor nanosheets 104. The etching process can be performed by a chemical bath that selectively etches the sacrificial semiconductor cladding 114 with respect to the sacrificial semiconductor nanosheets 106 and the semiconductor nanosheets 104. As described previously, in one example the sacrificial semiconductor cladding 114 is SiGe with a significantly higher concentration of germanium with respect to the sacrificial semiconductor nanosheets 106. This difference in composition allows the sacrificial semiconductor cladding 114 to be selectively etched with respect to the sacrificial semiconductor nanosheets 106. Accordingly, the etching process of FIG. 1K recesses the sacrificial semiconductor cladding 114 without significantly etching the sacrificial semiconductor nanosheets 106 and the semiconductor nanosheets 104.

In FIG. 1L, the cladding inner spacer layer 134 has been deposited and patterned. The cladding inner spacer layer 134 can be deposited by ALD, CVD, PVD, or another suitable deposition process. After deposition of the cladding inner spacer layer 134, the cladding the spacer layer is etched using the gate spacer layer 132 as a mask. Accordingly, the cladding inner spacer layer 134 is entirely removed except directly below the gate spacer layer 132. In one example, the cladding inner spacer layer 134 is SiCON, but with different concentrations of the various elements with respect to the material of the gate spacer layer 132. The result is that the cladding inner spacer layer 134 can be selectively etched with respect to the gate spacer layer 132. Other materials and deposition processes can be utilized for the cladding inner spacer layer 134 without departing from the scope of the present disclosure.

In FIG. 1M is etching process has been performed to recess the sacrificial semiconductor nanosheets 106 with respect to the sacrificial semiconductor cladding 114 and the semiconductor nanosheets 104. The etching process can be performed by a chemical bath that selectively etches the sacrificial semiconductor nanosheets 106 with respect to the sacrificial semiconductor cladding 114 and the semiconductor nanosheets 104. As described previously, in one example the sacrificial semiconductor nanosheets 106 are SiGe with a significantly lower concentration of germanium with respect to the sacrificial semiconductor cladding 114. This difference in composition allows the sacrificial semiconductor nanosheets 106 to be selectively etched with respect to the sacrificial semiconductor cladding 114. Accordingly, the etching process of FIG. 1M recesses the sacrificial semiconductor nanosheets 106 without significantly etching the sacrificial semiconductor cladding 114 and the semiconductor nanosheets 104. The etching process is timed so that the sacrificial semiconductor nanosheets 106 are recessed but not entirely removed. The recessing process is utilized to enable the formation of an inner sheet spacer layer between the semiconductor nanosheets 104 at the locations where the sacrificial semiconductor nanosheets 106 have been removed.

In FIG. 1N a sheet inner spacer layer 136 has been deposited between the semiconductor nanosheets 104. The sheet inner spacer layer 136 can be deposited by an ALD process, a CVD process, or other suitable processes. In one example, the sheet inner spacer layer 136 includes silicon nitride. After deposition of the sheet inner spacer layer 136, and etching processes performed utilizing the gate spacer layer 132 as a mask. The etching process removes the sheet inner spacer layer 136 except directly below the gate spacer layer 132.

One benefit of the process for depositing the cladding inner spacer layer 134 and the sheet inner spacer layer 136 in the manner described is that there are no voids or gaps between the cladding inner spacer 134 and the sheet inner spacer layer 136. This is a result of the selective recessing processes of the sacrificial semiconductor cladding 114 and the sacrificial semiconductor nanosheets 106.

In FIG. 1O source and drain regions 138 have been formed. The source and drain regions 138 includes semiconductor material. The source and drain regions 138 can be grown epitaxially from the semiconductor nanosheets 104. The source and drain regions 138 can be epitaxially grown from the semiconductor nanosheets 104 or from the substrate 102. The source and drain regions 138 can be doped with N-type dopants species in the case of N-type transistors. The source and drain regions 138 can be doped with P-type dopant species in the case of P-type transistors. The doping can be performed in-situ during the epitaxial growth. The hybrid fin structures 118 can act as electrical isolation between the source and drain regions 138 of adjacent transistors.

In FIG. 1P an etching process has been performed to remove the dielectric layers 128 and 130 from above the layer of polysilicon 126. The etching process also removes a portion of the gate spacer layer 132. Multiple etching steps can be utilized to remove the dielectric layers 128 and 132 and the portion of the gate spacer layer 132.

In FIG. 1P a dielectric layer 140 has been deposited on the source and drain regions 138 and on the high-K dielectric layer 124. The dielectric layer 140 can include silicon nitride or SiCON. The dielectric layer 140 can be deposited by CVD, ALD, or other suitable processes. In an interlevel dielectric layer 142 has been deposited on the dielectric layer 140. The interlevel dielectric layer 142 can include silicon oxide. The interlevel dielectric layer 142 can be deposited by CVD, ALD, or other suitable processes. Other materials and processes can be utilized for the dielectric layer 140 in the interlevel dielectric layer 142 without departing from the scope of the present disclosure.

In FIG. 1Q an etching process has been performed to recess the polysilicon layer 126. The recessing process removes about half the thickness of the polysilicon layer 126. After the recessing process, a mask 146 is formed and patterned on the polysilicon 126 on the interlevel dielectric layer 142 and on the gate spacer layer 132. The pattern of the mask 146 exposes the high-K dielectric layer 124 on the right side. A subsequent etching processes are performed to further recess the layer of polysilicon 126 and to remove a portion of the exposed high-K dielectric layer 124. The mask 146 can include photo resist, a hard mask, or combination of the hard mask and photo resist.

The view of FIG. 1Q does not show the source and drain regions 138, the interlevel dielectric layer 142, the dielectric layer 140, the gate spacer layer 132, the cladding inner spacer layer 134, or the sheet inner spacer layer 136 in the foreground of the integrated circuit 100 so as to enable illustration of the recessing of the layer polysilicon 126 and the high-K dielectric layer 124. The omitted structures are nevertheless still present at the processing stage shown in FIG. 1Q. The structures will also be omitted in the views of FIGS. 1R-1U, though they are still present at the corresponding stages of processing.

In FIG. 1R, the mask 146 and the layer of photoresist 126 have been removed. The thin dielectric layer 131 has also been removed. The structures can be removed via one or more etching process including wet etches, dry etches, or other types of etching processes.

In FIG. 1S, the sacrificial semiconductor nanosheets 106 and the sacrificial semiconductor cladding 114 has been removed. The sacrificial semiconductor cladding 114 can be removed in a first etching step. The sacrificial semiconductor nanosheets 106 can then be removed in a second etching step. Both the first and the second etching steps selectively etches the corresponding layer with respect to the material of the semiconductor nanosheets 104. Alternatively, a single etching process can be utilized to remove both the sacrificial semiconductor cladding 114 and the sacrificial semiconductor nanosheets 106.

After the etching process, the semiconductor nanosheets 104 are no longer covered by sacrificial semiconductor structures. Gate dielectric and gate metal structures can now be formed around the semiconductor nanosheets 104 as will be described with reference to subsequent figures. As described previously, the cladding inner spacer layer 134, the sheet interspace are layers 136, the source and drain regions 138, and the dielectric layers 140, 142, and 132 are still present in the foreground, though they are not shown in FIG. 1S, for clarity illustrating the removal of the sacrificial semiconductor cladding 114 and nanosheets 106.

In FIG. 1T a gate dielectric 146 has been deposited on the exposed surfaces of the semiconductor nanosheets 104. The gate dielectric 146 is shown as only a single layer, in practice, the gate dielectric 146 may include multiple dielectric layers. For example, the gate dielectric 146 may include an interfacial dielectric layer that is in direct contact with the semiconductor nanosheets 104. The gate dielectric 146 may include a high-K gate dielectric layer positioned on the interfacial dielectric layer. Together, the interfacial dielectric layer and the high-K gate dielectric layer form a gate dielectric for the gate all around nanosheet transistors.

The interfacial dielectric layer can include a dielectric material such as silicon oxide, silicon nitride, or other suitable dielectric materials. The interfacial dielectric layer can include a comparatively low-K dielectric with respect to high-K dielectric such as hafnium oxide or other high-K dielectric materials that may be used in gate dielectrics of transistors.

The interfacial dielectric layer can be formed by a thermal oxidation process, a chemical vapor deposition (CVD) process, or an atomic layer deposition (ALD) process. The interfacial dielectric layer can have a thickness between 0.5 nm and 2 nm. One consideration in selecting a thickness for the interfacial dielectric layer is to leave sufficient space between the nanosheets 104 for gate metals, as will be explained in more detail below. Other materials, deposition processes, and thicknesses can be utilized for the interfacial dielectric layer without departing from the scope of the present disclosure.

The high-K gate dielectric layer and the interfacial dielectric layer physically separate the semiconductor nanosheets 104 from the gate metals that will be deposited in subsequent steps. The high-K gate dielectric layer and the interfacial dielectric layer isolate the gate metals from the semiconductor nanosheets 104 that correspond to the channel regions of the transistors.

The high-K gate dielectric layer includes one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K gate dielectric layer may be formed by CVD, ALD, or any suitable method. In one embodiment, the high-K gate dielectric layer is formed using a highly conformal deposition process such as ALD in order to ensure the formation of a gate dielectric layer having a uniform thickness around each semiconductor nanosheet 104. In one embodiment, the thickness of the high-k dielectric is in a range from about 1 nm to about 3 nm. Other thicknesses, deposition processes, and materials can be utilized for the high-K gate dielectric layer without departing from the scope of the present disclosure. The high-K gate dielectric layer may include a first layer that includes HfO2 with dipole doping including La and Mg, and a second layer including a higher-K ZrO layer with crystallization.

After deposition of the gate dielectric 146, a gate metal 148 is deposited. The gate metal 148 surrounds the semiconductor nanosheets 104. In particular, the gate metal 148 is in contact with the gate dielectric 146. The gate metal 148 is positioned between semiconductor nanosheets 104. In other words, the gate metal 140 is positioned all around the semiconductor nanosheets 104. For this reason, the transistors formed in relation to the semiconductor nanosheets 104 are called gate all around transistors.

All of the gate metal 140 is shown as a single metal layer, and practice the gate metal 148 may include multiple metal layers. For example, the gate metal 148 may include one or more very thin work function layers in contact with the gate dielectric 146. The thin work function layers can include titanium nitride, tantalum nitride, or other conductive materials suitable for providing a selected work function for the transistors. The gate metal 140 can further include a gate fill material that corresponds to the majority of the gate metal 148. The gate fill material can include cobalt, tungsten, aluminum, or other suitable conductive materials. The layers of the gate metal 148 can be deposited by PVD, ALD, CVD, or other suitable deposition processes.

In FIG. 1U, an etching process has been performed to recess the gate metal 148. In particular, the gate metal 140 is recessed such that the top surface of the gate metal 148 is below a top surface of the high-K dielectric 124. The high-K gate dielectric 124 electrically isolates the gate metal of the transistor associated with the leftmost stack of semiconductor nanosheets 104 from the gate metal associated with the middle and right stacks of semiconductor nanosheets 104. In FIG. 1U a cap layer 150 has been deposited on top of the gate metal 148. The cap 150 layer can include one or more of SiCN, SiN, or SiCON. The cap layer 150 can be deposited by CVD, ALD, or other suitable processes.

FIG. 1V again illustrates the source and drain regions 138, the cladding inner spacer 134, the gate spacer layer 132, the dielectric layer 140, and the interlevel dielectric layer 142 in the foreground. In FIG. 1V, trenches 152 have been formed in the interlevel dielectric layer 142. The trenches 152 expose the source and drain regions 138 so that metal contacts can be formed in contact with the source and drain regions 138. The trenches 152 can be formed utilizing standard photolithography techniques including masking and etching the interlevel dielectric layer 142 to expose the source and drain regions 138.

In FIG. 1W, source and drain contacts 154 have been formed in the trenches 152 in the interlevel dielectric layer 142. The source and drain contacts 154 can include conductive material such as tungsten, cobalt, copper, titanium, aluminum, or other suitable conductive materials by which voltages can be applied to the source and drain regions 138. The source and drain contacts 154 can be formed by PVD, CVD, ALD, or other suitable deposition processes. Other materials and deposition processes can be utilized for the source and drain contacts 154 without departing from the scope of the present disclosure.

Figure 1X:
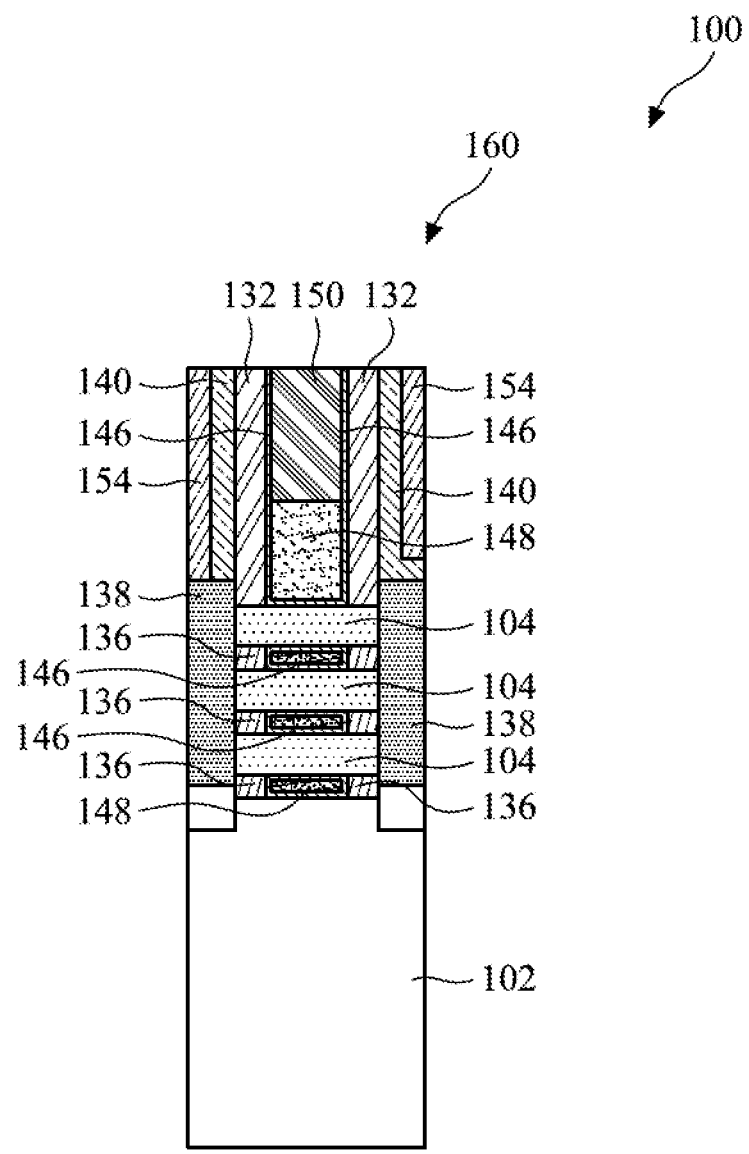

FIG. 1X is a cross-sectional view of the integrated circuit 100 of FIG. 1W taken along cut lines X. The view of FIG. 1X illustrates a single gate all around nanosheet transistor. Each semiconductor nanosheet 104 extends horizontally between two source/drain regions 138. The gate dielectric 146 is positioned on the surface of each semiconductor nanosheet 104. The gate metal 148 is positioned on the gate dielectric 146 around each semiconductor nanosheet 104. Source and drain contacts 154 contacts the source and drain regions 138. The gate spacer layer 132 is positioned above the top semiconductor nanosheet 104 on either side of the gate metal 148. The gate dielectric 146 is formed along the gate spacer layer 132 above the top semiconductor nanosheet 104. The cap layer 150 is positioned on the gate metal 148 between the gate spacer layer 132.

The sheet inner spacers 136 are positioned between the semiconductor nanosheets 104 adjacent to the source and drain regions. The lateral distance spanned by each sheet inner spacer 136 from the inner edge of the adjacent source/drain regions 138 to the gate dielectric 146 corresponds to the lateral distance by which the sacrificial semiconductor nanosheets 106 were recessed in the process step described and shown in relation to FIG. 1M. In one example, this lateral distances between 3 nm and 15 nm. Other dimensions are possible for the sheet inner spacer 136 without departing from the scope of the present disclosure.

The gate all around transistor 160 functions by applying biasing voltages to the gate metal 148 and to the source and drain contacts 154. The biasing voltages cause a channel current to flow through the semiconductor nanosheets 104 between the source/drain regions 138. Accordingly, the semiconductor nanosheets 104 corresponds to channel regions of the gate all around transistor 160.

Figure 1Y:
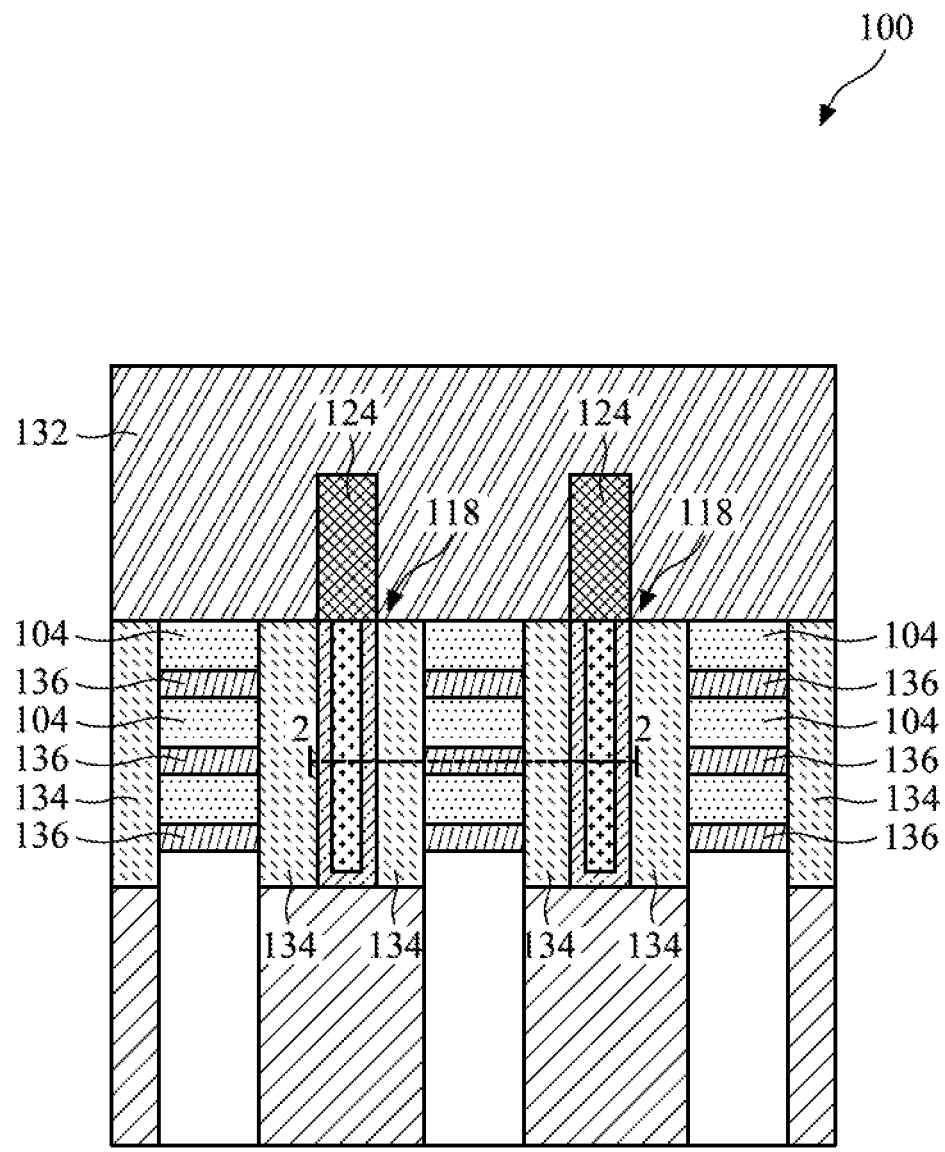

FIG. 1Y is a cross-sectional view of the integrated circuit 100 of FIG. 1W taken along cut lines Y. FIG. 1Y illustrates some of the benefits of the integrated circuit 100. The formation of the cladding inner spacer 134 and the sheet inner spacers 136 by selectively recessing each of the sacrificial semiconductor cladding region 114 and the sacrificial semiconductor nanosheets 106 results in a complete lack of voids in the region where the sheet inner spacers 136 meet the cladding inner spacers 134. This results in more robust transistors with better performance.

In one embodiment, the lateral width of the cladding inner spacers 134 is between 5 nm and 15 nm. The depth of the cladding inner spacers 134 can be between 3 nm and 20 nm. Other dimensions can be utilized for the cladding inner spacers 134 without departing from the scope of the present disclosure.

Figure 1Z:
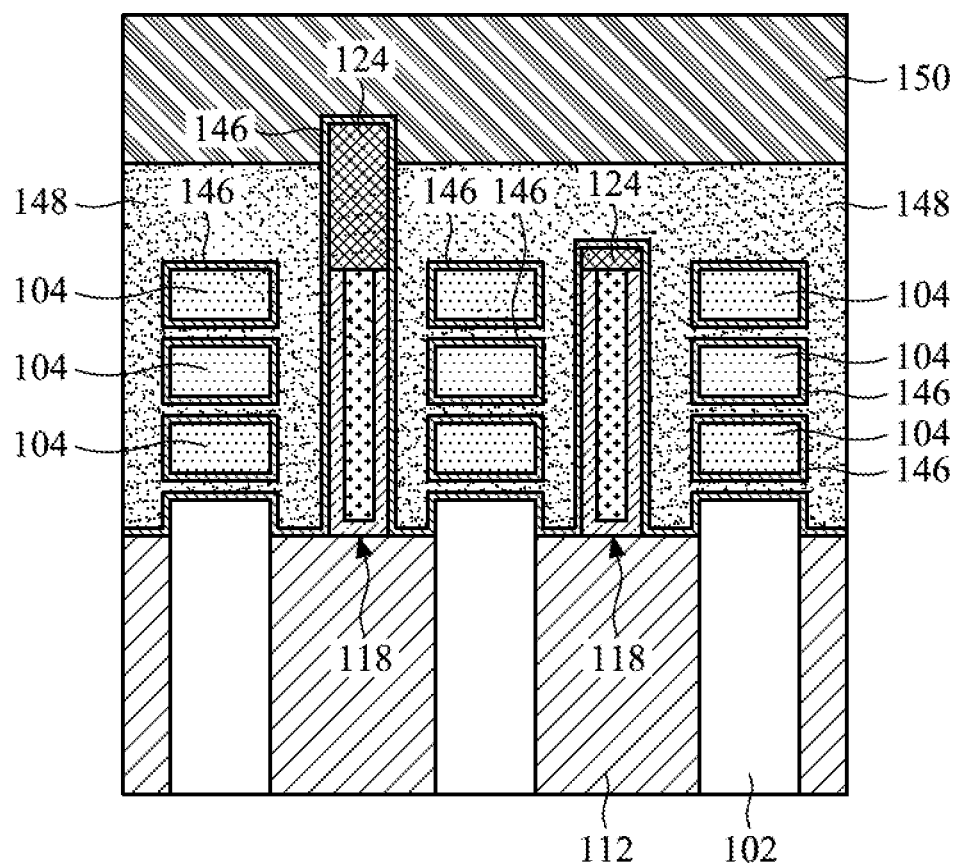

FIG. 1Z is a cross-sectional view of the integrated circuit 100 of FIG. 1W taken along cut lines Z, according to one embodiment. FIG. 1C clearly illustrates that the gate dielectric 146 surrounds each semiconductor nanosheet 104. FIG. 1C also illustrates that the gate metal 148 surrounds the semiconductor nanosheets 104, with the gate dielectric 146 positioned between the semiconductor nanosheets 104 and the gate metal 148. FIG. 1Z also illustrates how the left high-K dielectric layer 124 and the left hybrid fin structure 118 to electrically isolate the gate metal 148 associated with the left transistor from the gate metal 148 associated with the middle and right transistors.

Figure 2:
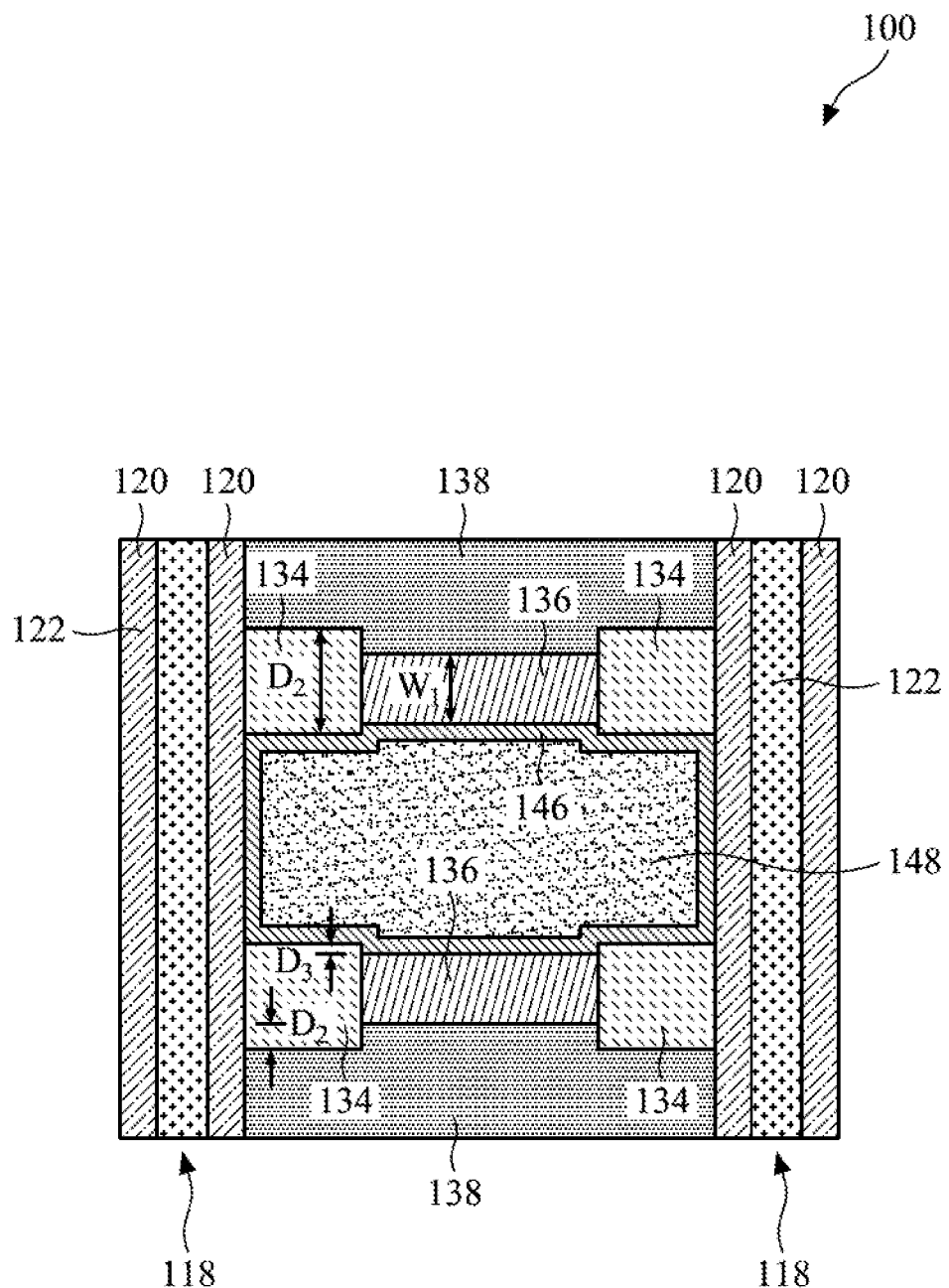

FIG. 2 is an enlarged top view of a plane cut of the integrated circuit 100 of FIG. 1Y taken along cut lines 2, according to one embodiment. Accordingly, the view of FIG. 2 illustrates the gate metal 148 between two semiconductor nanosheets 104 of the middle stack of semiconductor nanosheets 104 of FIG. 1Y. The view of FIG. 2 illustrates the lateral width W1 of the sheet inner spacers 136 extending between the source/drain regions 138 and the gate dielectric 146. W1 is between 3 nm and 15. The view of FIG. 2 illustrates the lateral width W2 of the cladding inner spacers 134 extending between the source/drain regions 138 and the gate dielectric 146. W2 is between 3 nm and 20 nm. FIG. 2 also illustrates that the cladding inner spacers 134 extend laterally beyond the sheet inner spacers 136 by distance W3 on either side. In one example, W3 is between 0 nm and 3 nm. W3 may not be equal on both sides. Other dimensions are possible without departing from the scope of the present disclosure. One result of this is that the source/drain regions 138 protrude inward at the sheet inner spacers 136 than at the cladding inner spacers 134.

In one embodiment, a method includes forming a stack of semiconductor nanosheets corresponding to channel regions of a gate all around transistor, forming a plurality of sacrificial semiconductor nanosheets between the semiconductor nanosheets and having a first composition, and forming a sacrificial semiconductor cladding in contact with the stack of semiconductor nanosheets and the sacrificial semiconductor nanosheets and having a second composition different than the first composition. The method includes exposing a portion of the semiconductor nanosheets by recessing the sacrificial semiconductor cladding with a first etching process and forming a cladding inner spacer on the portion of the semiconductor nanosheets exposed by recessing the sacrificial semiconductor cladding. The method includes removing a portion of each sacrificial semiconductor nanosheet by recessing the sacrificial semiconductor nanosheet with a second etching process and forming a respective sheet inner spacer in place of a recessed portion of each sacrificial semiconductor nanosheet.

In one embodiment, a method incudes a method includes forming a plurality of semiconductor nanosheets corresponding to channel regions of a gate all around transistor, forming, with a first deposition process, a plurality of sheet inner spacers each between a respective pair of semiconductor nanosheets, and forming, with a second deposition process, a cladding inner spacer in contact with each of the nanosheets and the sheet inner spacers. The method incudes forming a source region of the transistor in contact with the semiconductor nanosheets, the sheet inner spacers, and the cladding inner spacer, depositing a gate dielectric of the transistor on the semiconductor nanosheets and on the sheet inner spacers, and depositing a gate metal of the transistor on the gate dielectric and between the semiconductor nanosheets.

In one embodiment, an integrated circuit includes a gate all around transistor. The gate all around transistor includes a source region, a drain region, and a plurality of semiconductor nanosheets corresponding to channel regions of the transistor and each extending between the source region and the drain region. The transistor includes a cladding inner spacer extending vertically and in contact with the source region and each semiconductor nanosheet and a plurality of sheet inner spacers each positioned between a respective pair of the semiconductor nanosheets and in contact with the cladding inner spacer and the source region. The transistor includes a gate dielectric positioned on the semiconductor nanosheets and a gate metal positioned on the gate dielectric and between the semiconductor nanosheets.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a first channel of a transistor;
   forming a second channel of the transistor above the first channel;
   forming a sheet inner spacer of a first composition between channel and the second channel;
   forming a cladding inner spacer of a second composition different than the first composition in contact with the first channel and the second channel;
   forming a gate metal of the transistor wrapped around the first channel and the second channel; and
   forming a source/drain region in contact with the first channel and the second channel and separated from the gate metal in a first lateral direction, wherein the sheet inner spacer is positioned between the gate metal and the source/drain region and has a first lateral thickness in the first direction, wherein the cladding inner spacer is positioned between the gate metal and the source/drain region and has a second lateral thickness in the first direction greater than the first lateral thickness.

2. The method of claim 1, comprising, prior to forming cladding inner spacer:
   forming a sacrificial semiconductor nanosheet between the first and second channel;
   forming a sacrificial semiconductor cladding in contact with the first and second channel and the sacrificial semiconductor nanosheet; and
   exposing a portion of first channel and the second channel by recessing the sacrificial semiconductor cladding with a first etching process.

3. The method of claim 2, comprising:
   forming the cladding inner spacer on the portion of the semiconductor nanosheets exposed by recessing the sacrificial semiconductor cladding;
   removing a portion of the sacrificial semiconductor nanosheet by recessing the sacrificial semiconductor nanosheet with a second etching process; and
   forming the sheet inner spacer in place of a recessed portion of the sacrificial semiconductor nanosheet.

4. The method of claim 3, wherein the first etching process etches the sacrificial semiconductor nanosheet at a higher rate than the sacrificial semiconductor cladding.

5. The method of claim 4, wherein both the sacrificial semiconductor cladding and the sacrificial semiconductor nanosheet are exposed to the first etching process.

6. The method of claim 5, wherein both the sacrificial semiconductor cladding and the sacrificial semiconductor nanosheet are exposed to the second etching process.

7. The method of claim 3, further comprising entirely removing the sacrificial semiconductor cladding after forming the cladding inner spacer.

8. The method of claim 7, further comprising entirely removing the sacrificial semiconductor nanosheet after forming the sheet inner spacer.

9. The method of claim 8, further comprising forming the source/drain region of the transistor in contact with the cladding inner spacer and the sheet inner spacers.

10. The method of claim 9, further comprising depositing a gate dielectric of the transistor on the semiconductor nanosheet, on the cladding inner spacer, and on the sheet inner spacers.

11. The method of claim 10, further comprising depositing the gate metal on the gate dielectric and between the first and second channels.

12. The method of claim 1, wherein the first and second channels are silicon, the sacrificial semiconductor nanosheet is silicon germanium with 20%-30% germanium concentration, and the sacrificial semiconductor cladding is silicon germanium with 30%-50% germanium concentration.

13. A method, comprising:
forming a plurality of stacked channels of a transistor;
forming, with a first deposition process, a plurality of sheet inner spacers each between a respective pair of the channels;
forming, with a second deposition process, a cladding inner spacer in contact with each of the channels and the sheet inner spacers;
forming a source/drain region of the transistor in contact with the channels, the sheet inner spacers, and the cladding inner spacer;
depositing a gate dielectric of the transistor on the channels and on the sheet inner spacers; and
depositing a gate metal of the transistor on the gate dielectric and between the channels, wherein the cladding inner spacer is thicker than the sheet inner spacers in a lateral direction separating the gate metal from the source/drain region.

14. The method of claim 13, wherein forming the plurality of sheet inner spacers includes:
partially removing sacrificial semiconductor nanosheets from between the channels; and
depositing the sheet inner spacers where the sacrificial semiconductor nanosheets were removed.

15. The method of claim 14, wherein forming the cladding inner spacer includes:
partially removing a sacrificial semiconductor cladding from the channels; and
depositing the cladding inner spacer where the sacrificial semiconductor cladding was partially removed.

16. The method of claim 15, wherein the cladding inner spacer includes silicon nitride or SiCON.

17. The method of claim 13, wherein the sheet inner spacers include silicon nitride or SiCON.

18. An integrated circuit, comprising:
a gate all around transistor, the gate all around transistor including:
a source/drain region;
a first channel;
a second channel above the first channel;
a cladding inner spacer extending vertically and in contact with the source/drain region, the first channel, and the second channel;
a sheet inner spacer between the first channel and the second channel and in contact with the first channel, the second channel, the cladding inner spacer and the source/drain region, wherein the cladding inner spacer and the sheet inner spacers are different dielectric materials;
a gate dielectric positioned on the first channel and the second channel; and
a gate metal positioned on the gate dielectric and wrapped around the first channel and the second channel and separated from the source/drain region by the cladding inner spacer and the sheet inner spacer.

19. The integrated circuit of claim 18, wherein the cladding inner spacer and the sheet inner spacers are a same dielectric material.

20. The integrated circuit of claim 18, wherein the cladding inner spacer and the sheet inner spacers are different dielectric materials.

* * * * *